(12) United States Patent
Takahashi et al.

(10) Patent No.: US 8,884,497 B2
(45) Date of Patent: Nov. 11, 2014

(54) PIEZOELECTRIC ACTUATOR AND A METHOD OF MANUFACTURING THE SAME

(75) Inventors: Soumei Takahashi, Tokyo (JP); Tsuyoshi Ishii, Tokyo (JP); Tsukasa Yamada, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 225 days.

(21) Appl. No.: 13/257,619

(22) PCT Filed: Apr. 15, 2010

(86) PCT No.: PCT/JP2010/056790
§ 371 (c)(1),
(2), (4) Date: Sep. 20, 2011

(87) PCT Pub. No.: WO2010/122950
PCT Pub. Date: Oct. 28, 2010

(65) Prior Publication Data
US 2012/0007477 A1    Jan. 12, 2012

(30) Foreign Application Priority Data

Apr. 24, 2009  (JP) .................................. 2009-106085

(51) Int. Cl.
*H01L 41/047*    (2006.01)
*H01L 41/09*    (2006.01)
*H01L 41/318*    (2013.01)

(52) U.S. Cl.
CPC ........... *H01L 41/0953* (2013.01); *H01L 41/318* (2013.01); *H01L 41/047* (2013.01)

USPC ............................ 310/348; 310/330; 310/365

(58) Field of Classification Search
USPC .......................... 310/328, 330–332, 348, 365
See application file for complete search history.

(56) References Cited

U.S. PATENT DOCUMENTS

| 7,719,169 | B2 * | 5/2010 | Kawakubo et al. ........... 310/332 |
| 2007/0231065 | A1 | 10/2007 | Kim et al. |
| 2007/0241641 | A1 * | 10/2007 | Kato et al. .................... 310/332 |
| 2008/0042521 | A1 * | 2/2008 | Kawakubo et al. ........... 310/328 |
| 2009/0026892 | A1 | 1/2009 | Nakamura et al. |
| 2009/0212664 | A1 * | 8/2009 | Nguyen et al. ................ 310/328 |

FOREIGN PATENT DOCUMENTS

| JP | 06-068528 | 3/1994 |
| JP | 2007-273451 | 10/2007 |
| JP | 2008-035600 | 2/2008 |
| JP | 2008-183658 | 8/2008 |

OTHER PUBLICATIONS

International Search Report mailed on Jul. 13, 2010.

* cited by examiner

*Primary Examiner* — Derek Rosenau
(74) *Attorney, Agent, or Firm* — IPUSA, PLLC

(57) ABSTRACT

A piezoelectric actuator including first and second piezoelectric cantilevers is disclosed. Wirings are provided on an upper surface of a support body on which the first and second piezoelectric cantilevers are formed. The wirings are formed of patterned metal films.

7 Claims, 41 Drawing Sheets

PIEZOELECTRIC ACTUATOR AND A METHOD OF MANUFACTURING THE SAME

TECHNICAL FIELD

The present invention is related to a piezoelectric actuator and a method of manufacturing the same.

BACKGROUND ART

FIG. 1 is a plane view of a related-art piezoelectric actuator. FIG. 2 is a cross-sectional view of the piezoelectric actuator along a line X-X in FIG. 1.

With reference to FIGS. 1 and 2, the related-art piezoelectric actuator 200 includes a support member 201; pads 203-205; a common lower electrode 206; a first piezoelectric actuator 207; a second piezoelectric actuator 208; and a wiring 209.

The support member 201 includes a thick support part 211 and a support body 212 which is formed integrally with the support part 211 and is thinner than the support part 211. The support body 212 has an L-shape and is supported by the support part 211.

The support body 212 includes a first support part Z1 on which the first piezoelectric actuator 207 and the wiring 209 are formed, and a second support part Z2 on which the second piezoelectric actuator 208 is formed. The first support part Z1 is disposed between the support part 211 and the second support part Z2. The first support part Z1 includes an area in which the first piezoelectric actuator 207 is formed and an area in which the wiring 209 is formed.

The pads 203-205 are provided on an upper surface 211A of the support part 211. The pads 203 and 204 are provided for applying voltage to the first piezoelectric actuator 207. The pads 204 and 205 are provided for applying voltage to the second piezoelectric actuator 208.

The common lower electrode 206 is provided on an upper surface 212A of the support body 212. The common lower electrode 206 is electrically coupled to the pad 203.

The first piezoelectric actuator 207 is provided on an upper surface of the first support part Z1. The first piezoelectric actuator 207 includes a piezoelectric body 215; a part of the common lower electrode 206 which is located below the piezoelectric body 215; and an upper electrode 216 provided on the piezoelectric body 215.

The upper electrode 216 is electrically coupled to the pad 204. When the voltage is applied to the first piezoelectric actuator 207, the piezoelectric body 215 displaces in a first direction (specifically, a contraction direction or an expansion direction) to deform and bend the first support part Z1.

The second piezoelectric actuator 208 is provided on an upper surface of the second support part Z2. The second piezoelectric actuator 208 includes a piezoelectric body (not illustrated) formed from a piezoelectric material as is the case with the piezoelectric body 215; a part of the common lower electrode 206 which is located below the relevant piezoelectric body; and an upper electrode 218 provided on the relevant piezoelectric body to which the driving voltage whose phase is shifted by 180 degrees with respect to the upper electrode 216 is applied.

The upper electrode 218 is formed from the same material as the upper electrode 216. The upper electrode 218 is electrically coupled to the pad 205 via the wiring 209. The voltage is applied to the second piezoelectric actuator 208 such that the second piezoelectric actuator 208 is displaced in a second direction opposite to the first direction (for example, the second direction corresponds to the expansion direction if the first direction corresponds to the contraction direction).

With this arrangement, since the second support part Z2 can be bent in the direction opposite to the direction in which the first support part Z1 is bent, the bending amount of the support body 212 can be increased.

The wiring 209 is provided on an upper surface of a part of the common lower electrode 206 which is located in the first support part Z1. The wiring 209 includes a piezoelectric body 221 which is formed on the common lower electrode 206 and is formed from the piezoelectric material as is the case with the piezoelectric body 215; and a wiring body 223 formed from the same material as the upper electrodes 216 and 218. The wiring body 223 has an end portion coupled to the pad 205 and another end portion coupled to the upper electrode 218. The piezoelectric body 221 is deformed in the second direction when the voltage is applied to the second piezoelectric actuator 208.

It is noted that the first piezoelectric actuator 207, the second piezoelectric actuator 208 and the wiring 209 are formed by successively forming on the common lower electrode 206 a piezoelectric film (for example, a PZT (zircon acid lead titanium) film) as a base material for the piezoelectric bodies 215 and 221 and a metal layer (for example, Ti/Pt multilayered film formed by multilayering a Ti film and a Pt film) as a base material for the upper electrodes 207 and 208, and then patterning the piezoelectric film and the metal film by etching (see Patent Document 1, for example).

[Patent Document 1] Japanese Laid-open Patent Publication No. 2008-35600

DISCLOSURE OF INVENTION

Problem to be Solved by Invention

However, according to the related-art piezoelectric actuator 200, on the upper surface of the first support part Z1 on which the first piezoelectric actuator 207 is formed are formed the first piezoelectric actuator 207 which is to be deformed in the first direction (specifically, the contraction direction or the expansion direction), and the wiring 209 which is to be deformed in the second direction opposite to the first direction (specifically, the second direction corresponds to the expansion direction if the first direction corresponds to the contraction direction).

Thus, a part of a deformation amount of the piezoelectric body 215 is canceled by the piezoelectric body 221 which is to be deformed in the opposite direction with respect to the piezoelectric body 215, which results in a problem that a bending efficiency of the first support part Z1 is reduced.

The present invention was made in consideration of the matter described above, and an object of the present invention is to provide a piezoelectric actuator and a method of manufacturing the same which can prevent the reduction of the bending efficiency due to the wiring provided on the support body.

Means to Solve the Problem

According to one aspect of the invention, a piezoelectric actuator is provided, which includes a support member including a frame body and a support body which is thinner than the frame body and has an end portion integrated with the frame body, the support body including plural first, second and third support parts, wherein the first support parts correspond to areas for forming first piezoelectric cantilevers, the second support parts correspond to areas for forming second piezoelectric cantilevers and are separated from the first support parts, and the third support parts couple the first support parts and the second support parts; first piezoelectric cantilevers including first lower electrodes, first piezoelectric bodies provided on the first lower electrodes, and first upper electrodes provided on the first piezoelectric bodies; second piezoelectric cantilevers including second lower electrodes, second piezoelectric bodies provided on the second lower electrodes, and second upper electrodes provided on the second piezoelectric bodies; first wirings provided on an upper surface of the support body for electrically coupling the first lower electrodes and the second lower electrodes; a second wiring provided on the upper surface of the support body, the second wiring being electrically coupled to the first upper electrodes provided on the first support parts; and a third wiring provided on the upper surface of the support body, the third wiring being electrically coupled to the second upper electrodes provided on the second support parts; wherein the second and third wirings are formed of metal films.

According to the present invention, since the second wiring, which is electrically coupled to the first upper electrodes provided on the first support parts, and the a third wiring, which is electrically coupled to the second upper electrodes provided on the second support parts, are formed of metal films, the second and third wirings no longer deform in opposite directions with respect to the first and the second piezoelectric bodies when the first and the second piezoelectric bodies are deformed by the voltage applied thereto, thereby preventing the reduction of the bending efficiency of the piezoelectric actuator.

According to another aspect of the invention, a method of manufacturing a piezoelectric actuator is provided, the piezoelectric actuator including a support member including a frame body and a support body which is thinner than the frame body and has an end portion integrated with the frame body, the support body including plural first, second and third support parts, wherein the first support parts correspond to areas for forming first piezoelectric cantilevers, the second support parts correspond to areas for forming second piezoelectric cantilevers and are separated from the first support parts, and the third support parts couple the first support parts and the second support parts; first piezoelectric cantilevers including first lower electrodes, first piezoelectric bodies provided on the first lower electrodes, and first upper electrodes provided on the first piezoelectric bodies; second piezoelectric cantilevers including second lower electrodes, second piezoelectric bodies provided on the second lower electrodes, and second upper electrodes provided on the second piezoelectric bodies; first wirings provided on an upper surface of the support body for electrically coupling the first lower electrodes and the second lower electrodes; a second wiring provided on the upper surface of the support body, the second wiring being electrically coupled to the first upper electrodes provided on the first support parts; and a third wiring provided on the upper surface of the support body, the third wiring being electrically coupled to the second upper electrodes provided on the second support parts; the method comprising: a piezoelectric cantilever base material forming process for successively forming, on an upper surface of a substrate as a base material for the support member, a first metal layer as a base material for the first and second lower electrodes, a dielectric layer as a base material for the first and second piezoelectric bodies and a second metal layer as a base material for the first and second upper electrodes; an upper electrode/piezoelectric body forming process for patterning the second metal layer and the dielectric layer by an etching process to simultaneously form the first and second upper electrodes and the first and second piezoelectric bodies; and a lower electrode/wiring forming process for patterning the first metal layer by an etching process to simultaneously form the first and second lower electrodes and the first, second and the third wirings.

According to the present invention, since the first and second lower electrodes and the first, second and third wirings are simultaneously formed by patterning the first metal layer as a base material for the first and second lower electrodes by an etching process, the second and third wirings include no dielectric material, thereby preventing the reduction of the bending efficiency of the piezoelectric actuator.

Further, by forming the first and second lower electrodes and the first, second and third wirings simultaneously, it is possible to reduce the manufacturing cost of the piezoelectric actuator in comparison with a case in which the second and third wirings are formed separately.

According to another aspect of the invention, a method of manufacturing a piezoelectric actuator is provided, the piezoelectric actuator including a support member including a frame body and a support body which is thinner than the frame body and has an end portion integrated with the frame body, the support body including plural first, second and third support parts, wherein the first support parts correspond to areas for forming first piezoelectric cantilevers, the second support parts correspond to areas for forming second piezoelectric cantilevers and are separated from the first support parts, and the third support parts couple the first support parts and the second support parts; first piezoelectric cantilevers including first lower electrodes, first piezoelectric bodies provided on the first lower electrodes, and first upper electrodes provided on the first piezoelectric bodies; second piezoelectric cantilevers including second lower electrodes, second piezoelectric bodies provided on the second lower electrodes, and second upper electrodes provided on the second piezoelectric bodies; first wirings provided on an upper surface of the support body for electrically coupling the first lower electrodes and the second lower electrodes; a second wiring provided on the upper surface of the support body, the second wiring being electrically coupled to the first upper electrodes provided on the first support parts; and a third wiring provided on the upper surface of the support body, the third wiring being electrically coupled to the second upper electrodes provided on the second support parts; the method comprising: a piezoelectric cantilever base material forming process for successively forming, on an upper surface of a substrate as a base material for the support member, a first metal layer as a base material for the first and second lower electrodes, a dielectric layer as a base material for the first and second piezoelectric bodies and a second metal layer as a base material for the first and second upper electrodes; a piezoelectric cantilever forming process for patterning the second metal layer, the dielectric layer and the first metal layer by an etching process to simultaneously form the first and second piezoelectric cantilevers; a lift-off resist film forming process for forming a resist film for lift-off on the upper surface of the substrate on which the first and second piezoelectric cantilevers are formed, the resist film having openings which have cross-sections of a reverse tapered shape and expose parts of the upper surface of the substrate associated with areas for forming the second and third wirings; a metal layer forming process for depositing a metal layer on the upper surface of the substrate via the openings after the lift-off resist film forming process; and a lift-off process for removing the resist film for lift-off to form the second and third wirings formed of the metal films on the upper surface of the substrate.

According to the present invention, since the second and third wirings are formed by a lift-off process after the first and second piezoelectric cantilevers have been formed, the second and third wirings include no dielectric material, thereby preventing the reduction of the bending efficiency of the piezoelectric actuator.

Further, since a material which has a smaller resistance value can be used to form the metal film as a base material for the second and third wirings, it is possible to form the second and third wirings which have the decreased resistance values.

According to another aspect of the invention, a method of manufacturing a piezoelectric actuator is provided, the piezoelectric actuator including a support member including a frame body and a support body which is thinner than the frame body and has an end portion integrated with the frame body, the support body including plural first, second and third support parts, wherein the first support parts correspond to areas for forming first piezoelectric cantilevers, the second support parts correspond to areas for forming second piezoelectric cantilevers and are separated from the first support parts, and the third support parts couple the first support parts and the second support parts; first piezoelectric cantilevers including first lower electrodes, first piezoelectric bodies provided on the first lower electrodes, and first upper electrodes provided on the first piezoelectric bodies; second piezoelectric cantilevers including second lower electrodes, second piezoelectric bodies provided on the second lower electrodes, and second upper electrodes provided on the second piezoelectric bodies; first wirings provided on an upper surface of the support body for electrically coupling the first lower electrodes and the second lower electrodes; a second wiring provided on the upper surface of the support body, the second wiring being electrically coupled to the first upper electrodes provided on the first support parts; and a third wiring provided on the upper surface of the support body, the third wiring being electrically coupled to the second upper electrodes provided on the second support parts; the method comprising: a second/third wirings forming process for forming a metal film on an upper surface of a substrate as a base material for the support member, and patterning the metal film to form the second and third wirings; an insulating layer forming process for forming an insulating layer, the insulating layer having a flat upper surface and covering the second and third wirings and the upper surface of the substrate; a piezoelectric cantilever base material forming process for successively forming, on the upper surface of the insulating layer, a first metal layer as a base material for the first and second lower electrodes, a dielectric layer as a base material for the first and second piezoelectric bodies and a second metal layer as a base material for the first and second upper electrodes; an upper electrode/piezoelectric body forming process for patterning the second metal layer and the dielectric layer by an etching process to simultaneously form the first and second upper electrodes and the first and second piezoelectric bodies; and a lower electrode/wiring forming process for patterning the first metal layer by an etching process to simultaneously form the first and second lower electrodes and the second and the third wirings.

According to the present invention, since the second and third wirings are formed by forming a metal film on the upper surface of the substrate as a base material for the support member and patterning the metal film, the second and third wirings include no dielectric material, thereby preventing the reduction of the bending efficiency of the piezoelectric actuator.

Further, since a material which has a smaller resistance value can be used to form the metal film as a base material for the second and third wirings, it is possible to form the second and third wirings which have the decreased resistance values.

Further, since the first and second piezoelectric cantilevers are formed on the upper surface of the insulating layer covering the second and third wirings, it is possible to form the first and second piezoelectric cantilevers on the overall parts of the upper surface of the insulating layer provided on the first and second support parts, thereby increasing the bending amount of the first and second piezoelectric cantilevers.

Advantage of the Invention

According to the present invention, it is possible to prevent the reduction of the bending efficiency due to the wiring provided on the support body.

Figure 1:
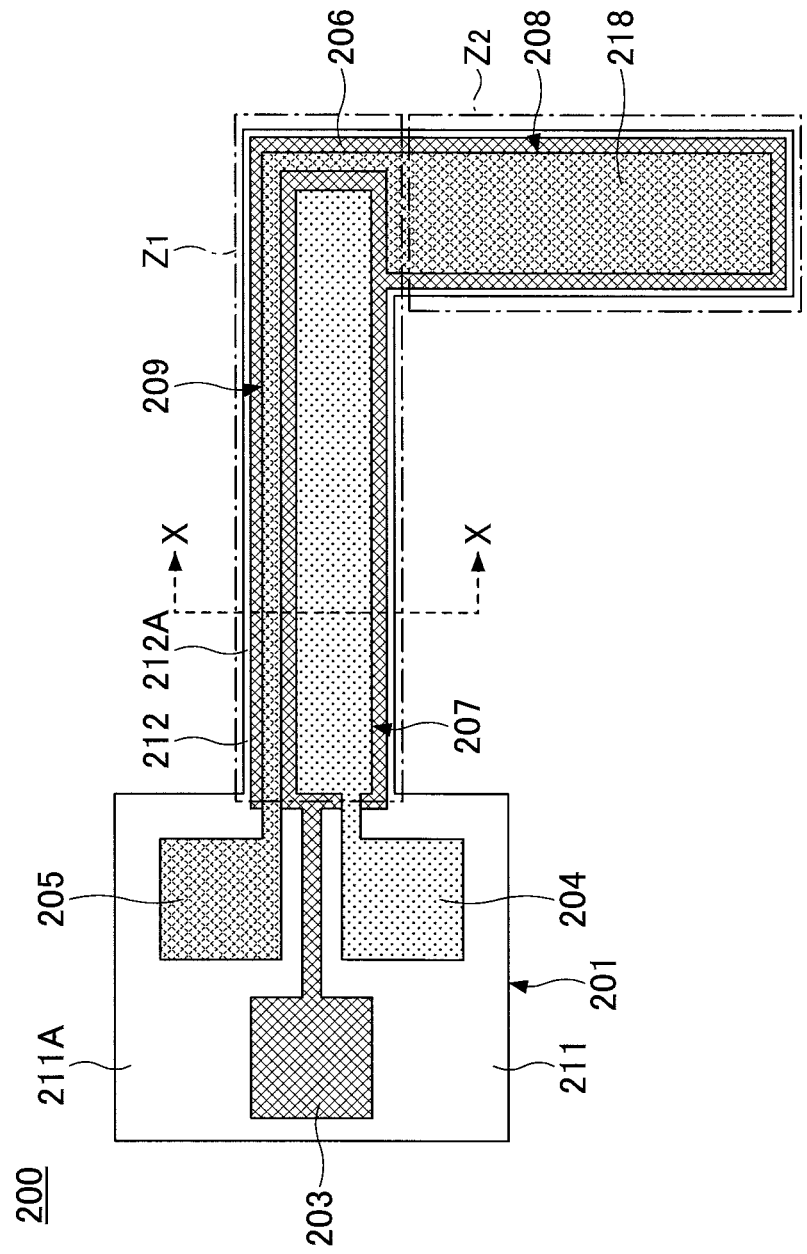
FIG. 1 is a plane view of a related-art piezoelectric actuator.
Figure 2:
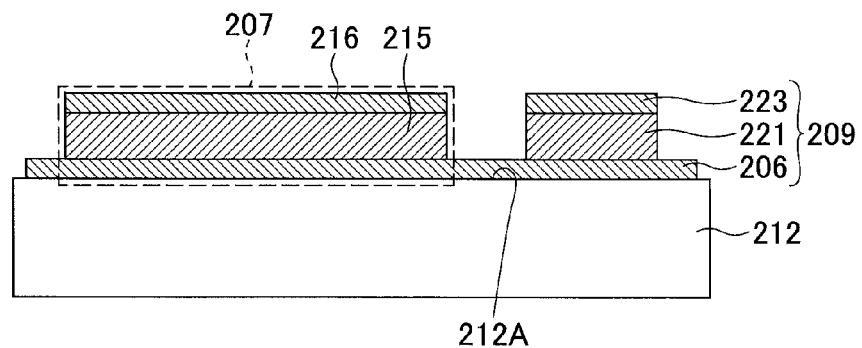
FIG. 2 is a cross-sectional view of the piezoelectric actuator along a line X-X in FIG. 1.

DESCRIPTION OF REFERENCE SYMBOLS 10,100,110 piezoelectric actuator
11 support member
13-15 pad
17,19, 25-1, 25-2, 26, 27, 34, 35, 36-1, 36-2, 37-1, 37-2, 112, 113, 118-1, 118-2, 131-137 wiring
21, 116 first piezoelectric cantilever
22, 117 second piezoelectric cantilever
31-1, 31-2, 31-3, 121-1, 121-2, 121-3, 121-4 first insulating element
32-1, 32-2, 32-3, 122-1, 122-2, 122-3 second insulating element
41 frame body
42 support body
45 first silicon substrate
45A, 46B, 49A lower surface
45B, 46A, 48A, 61A, 62A, 63A, 65A, 66A, 67A, 83A, 85A, 114A, 147A upper surface
46 second silicon substrate
47-49 $SiO_2$ film
51 coupling part
52 first support part
53 second support part
54, 55 third support part
61 first lower electrode
62 first piezoelectric body
63 first upper electrode
65 second lower electrode
66 second piezoelectric body
67 second upper electrode
71, 74 first coupling part
72, 75 second coupling part
81 substrate
83 first metal layer
84 dielectric layer
85 second metal layer
87, 89, 148, 151, 153, 155 resist film for etching
91, 105 resist film for lift-off
92, 106 opening part
94, 147 metal film
97 groove
114 insulating layer
141-143, 156 opening part
B predetermined direction
W1, W2, W3, W4, W5, W6 width Best Mode for Carrying Out the Invention In the following, embodiments of the present invention will be described with reference to the accompanying drawings.

[First Embodiment]

Figure 3:
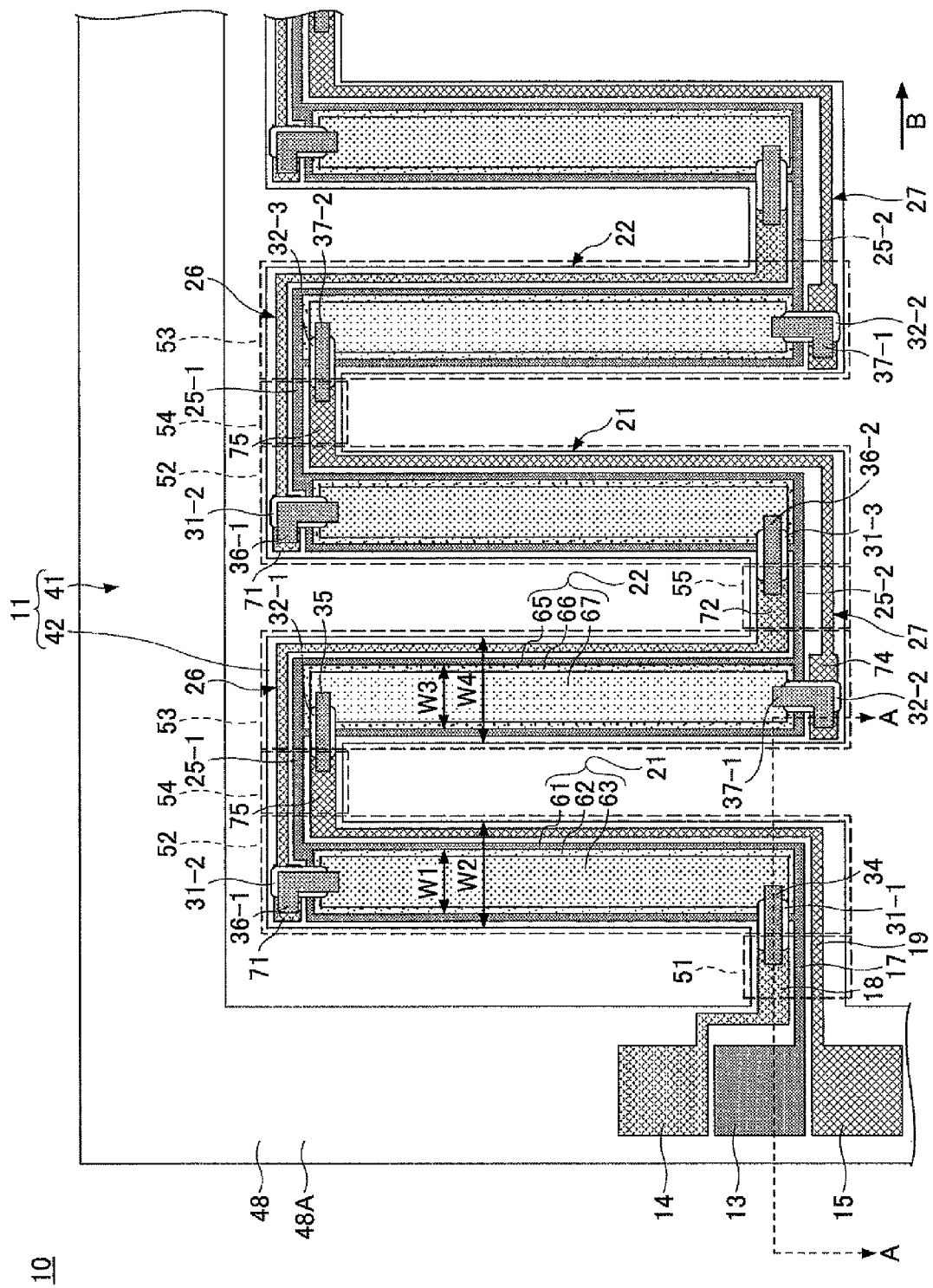
FIG. 3 is a plane view of the piezoelectric actuator according to a first embodiment of the present invention.
Figure 4:
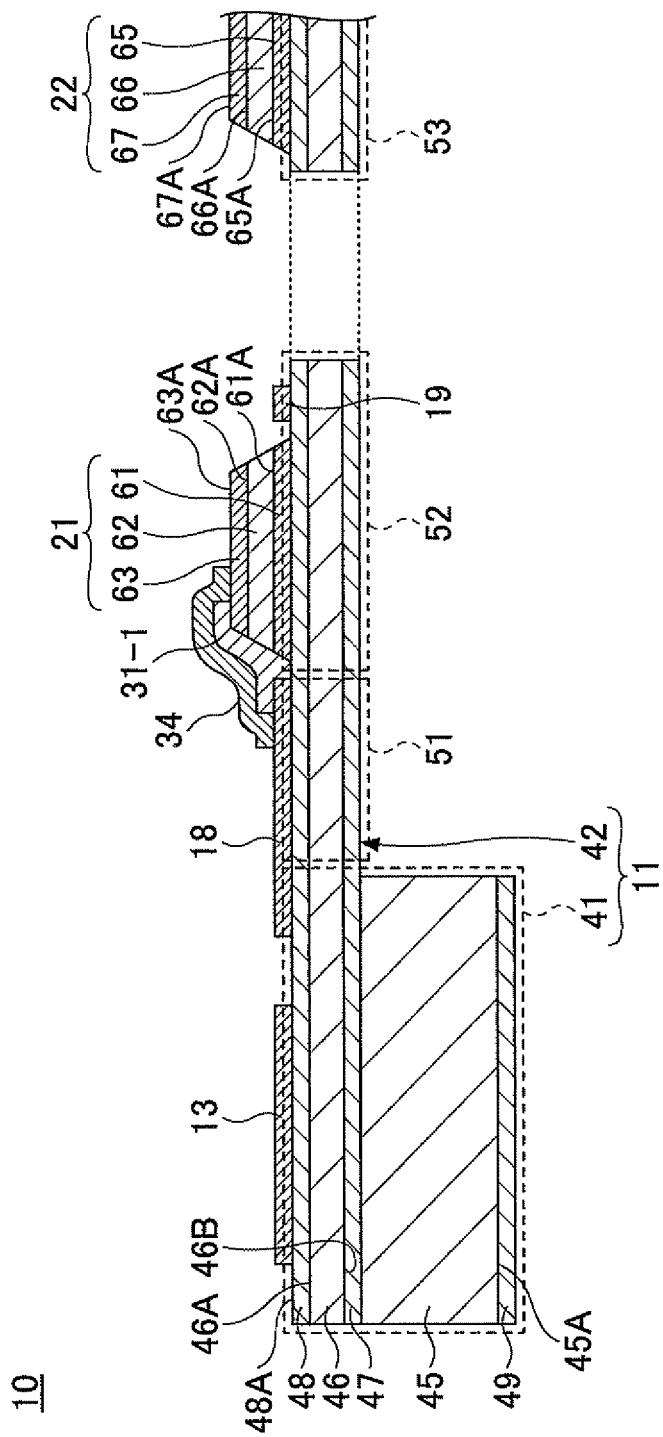
FIG. 4 is a cross-sectional view of the piezoelectric actuator along a line A-A in FIG. 3.

FIG. 1 is a plane view of the piezoelectric actuator according to a first embodiment of the present invention, and FIG. 4 is a cross-sectional view of the piezoelectric actuator along a line A-A in FIG. 3.

With reference to FIGS. 3 and 4, the piezoelectric actuator 10 according to the first embodiment includes a support member 11; pads 13-15; wirings 17, 18, 34, 35, 36-1, 36-2, 37-1 and 37-2; wirings 19 and 26 as second wirings; plural first piezoelectric cantilevers 21; plural second piezoelectric cantilevers 22; wirings 25-1 and 25-2 as first wirings; wirings 27 as third wirings; first insulating elements 31-1, 31-2 and 31-3; and second insulating elements 32-1, 32-2 and 32-3.

The support member 11 includes a frame body 41 and a support body 42. The frame body 41 includes a first silicon substrate 45 (thickness of 470 micrometers, for example); a second silicon substrate 46 (thickness of 30 micrometers, for example); a $SiO_2$ film 47 (thickness of 0.5 micrometers, for example) formed between the first and second silicon substrates 45 and 46; a $SiO_2$ film (thickness of 0.5 micrometers, for example) formed on an upper surface 46A of the second silicon substrate 46; and a $SiO_2$ film 49 (thickness of 0.5 micrometers, for example) formed on a lower surface 45A of the first silicon substrate 45.

The frame body 41 has such a shape that it surrounds the support body 42. The thickness of the frame body 41 is configured to be thicker than that of the support body 42. If the thickness of the support body 42 is 31 micrometers, the thickness of the frame body 41 can be 1.5 micrometers, for example. The frame body 41 is formed integrally with an end portion of the support body 42 and supports the support body 42.

The support body 42 includes a coupling part 51 disposed in the same plane; plural first support parts 52; and plural second support parts 54, 55.

The coupling part 51 has one end portion formed integrally with the support body 41 and another end portion formed integrally with an end portion of one of the first support parts 52.

The first support parts 52 are arranged side by side in a predetermined direction B such that the first support parts 52 are parallel with each other. The first support parts 52 are strip-shaped in a plane view. The first support parts 52 are arranged such that a longitudinal direction of the first support parts 52 is perpendicular to the predetermined direction B.

The second support parts 53 have the same shape as the first support parts 52. The second support parts 53 are arranged between the first support parts 52 such that the second support parts 53 are parallel with the first support parts 52. In other words, the first and second support parts 52 and 53 are disposed alternately in the predetermined direction B.

Each third support part 54 is disposed such that it couples one end portion of each second support part 53 and one end portion of one of the first support parts 52 adjacent to the corresponding second support part 53. The third support parts 54 are formed integrally with the first and second support parts 52 and 53 which are located on the opposite sides of the third support parts 54. The third support parts 54 have the same thickness as the first and second support parts 52 and 53.

Each third support part 55 is disposed such that it couples another end portion of each second support part 53 and another end portion of another first support part 52 adjacent to the corresponding second support part 53. The third support parts 55 are formed integrally with the first and second support parts 52 and 53 which are located on the opposite sides of the third support parts 55. The third support parts 55 have the same thickness as the first and second support parts 52 and 53.

The support body 42 is configured such that the second silicon substrate 46 (thickness of micrometers, for example); the $SiO_2$ film 47 (thickness of 0.5 micrometers, for example) formed on the lower surface 46B of the second silicon substrate 46; and a $SiO_2$ film 48 (thickness of 0.5 micrometers, for example) formed on the upper surface 46A of the second silicon substrate 46 are multilayered.

The pads 13-15 are provided on the upper surface of the frame body 41 (i.e., a part of the upper surface 48A of the $SiO_2$ film 48 which is included in the frame body 41). The pads 13-15 are disposed on a part of the frame body 41 which is located near the coupling part 51.

The pad 13 is coupled to one end of the wiring 17. The pad 13 is electrically coupled to the first and second lower electrodes 61 and 65 via the wirings 17, 25-1 and 25-2.

The pad 14 is coupled to one end of the wiring 18. The pad 14 is electrically coupled to the first upper electrodes 63 via the wirings 18, 34, 36-1 and 36-2.

The pad 15 is coupled to one end of the wiring 19. The pad 15 is electrically coupled to the second upper electrodes 67 via the wirings 19, 35, 37-1 and 37-2.

The pads 13 and 14 are provided for generating the potential difference between first upper electrodes 63 and first lower electrodes 61 (described hereinafter) which are included in the first piezoelectric cantilevers 21 to cause the first piezoelectric bodies 62, which are disposed between the first upper electrodes 63 and the first lower electrodes 61, to displace in the contraction or expansion direction when the voltage is applied between the pads 13 and 14.

The pads 13 and 15 are provided for generating the potential difference between second upper electrodes 67 and second lower electrodes 65 (described hereinafter) which are included in the second piezoelectric cantilevers 22 to cause the second piezoelectric bodies 66, which are disposed between the first upper electrodes 67 and the first lower electrodes 65, to displace in the direction opposite to the direction in which the first piezoelectric bodies 62 are displaced (if the first piezoelectric bodies 62 are displaced in the contraction direction, the second piezoelectric bodies 66 are displaced in the expansion direction) when the voltage is applied between the pads 13 and 15.

The pads 13-15 may be formed from the same material as the first and second lower electrodes 61 and 65, for example. The pads 13-15 may be formed of Ti/Pt multilayered films which are formed by successively forming on the upper surface 48A of the SiO2 film 48 Ti films (10 nm of thickness, for example) and Pt films (100 nm of thickness, for example), for example.

The wiring 17 is provided on a part of the upper surface of the support member 11 (i.e., a part of the upper surface 48A of the $SiO_2$ film 48 included in the support member 11) between the first piezoelectric cantilever 21, which is closest to the pad 13 among the first piezoelectric cantilevers 21, and the pad 13. The wiring 17 has one end portion formed integrally with the pad 13 and another end formed integrally with the first lower electrode 61 which is closest to the pad 13. In this way, the wiring 17 electrically couples the pad 13 and the first lower electrode 61 which is closest to the pad 13.

The wiring 18 is provided on a part of the upper surface of the support member 11 between the first piezoelectric cantilever 21, which is closest to the pad 14 among the piezoelectric cantilevers 21, and the pad 14. The wiring 18 has one end portion formed integrally with the pad 14 and another end formed on the upper surface of the coupling part 51.

The wiring 19 is provided on a part of the upper surface of the support member 11 between the second piezoelectric cantilever 22, which is closest to the pad 15 among the second piezoelectric cantilevers 22, and the pad 15. The wiring 19 has one end portion formed integrally with the pad 15. The wiring 19 has another end portion disposed on the upper surface of the third support part 54 between the first piezoelectric cantilever 21 which is closest to the coupling part 51 and the second piezoelectric cantilever 22 which is closest to the coupling part 51.

The wirings 17-19 described above may be formed of metal films. The wirings 17-19 may be formed of Ti/Pt multilayered films which are formed by successively forming on the upper surface 48A of the SiO2 film 48 Ti films (10 nm of thickness, for example) and Pt films (100 nm of thickness, for example), for example.

In this way, since the wirings 17-19 are formed of the metal films, components of the wirings 17-19 no longer include the piezoelectric material used for the first and second piezoelectric bodies 62 and 66. This prevents the wiring 19 from canceling a part of the displacement of the first piezoelectric body 62, and thus can prevent the reduction of the bending efficiency of the piezoelectric actuator 10 due to the wiring 19 provided on the support body 42.

It is noted that the piezoelectric material has an internal function (physical properties) by itself of performing a bi-directional conversion between the electric energy and the mechanical energy. The piezoelectric material may be a PZT (zircon acid lead titanium), for example.

The first piezoelectric cantilevers 21 include first lower electrodes 61, first piezoelectric bodies 62 and first upper electrodes 63. The first lower electrodes 61 are provided on upper surfaces of the first support parts 52. The first lower electrodes 61 are electrically coupled to the pad 13. The width W1 of the first lower electrodes 61 is smaller than the width W2 of the first support parts 52 such that the wirings 19 or 27 may be formed on the upper surfaces of the first support parts 52. If the width W2 of the first support parts 52 is 200 micrometers, the width W1 of the first piezoelectric bodies 62 may be 150 micrometers, for example.

The first lower electrodes 61 may be formed of Ti/Pt multilayered films which are formed by successively forming on the upper surface 48A of the SiO2 film 48 Ti films (10 nm of thickness, for example) and Pt films (100 nm of thickness, for example), for example.

The first piezoelectric bodies 62 are provided on the upper surfaces 61A of the first lower electrodes 61. The material of the first piezoelectric bodies 62 may be a PZT (zircon acid lead titanium), for example. The first piezoelectric bodies 62 may be PZT films (thickness of 2 micrometers, for example), for example.

The first upper electrodes 63 are provided on the upper surfaces 62A of the first piezoelectric bodies 62. The first upper electrodes 63 are electrically coupled to the pad 14. The first upper electrodes 63 may be formed of Ti/Pt multilayered films which are formed by successively forming on the upper surfaces 62A of the first piezoelectric bodies 62 Ti films (10 nm of thickness, for example) and Pt films (100 nm of thickness, for example), for example.

The first piezoelectric cantilevers 21 have sides which have inclined surfaces such that the width of the first piezoelectric cantilevers 21 increases when viewed from the first upper electrodes 63 to the first lower electrodes 61. The angle of inclination of the sides of the first piezoelectric cantilevers 21 may be 30 degrees, for example.

When the first piezoelectric cantilevers 21 have sides with such inclined surfaces, the upper surfaces of the first insulating elements 31-1, 31-2 and 31-3 disposed on the first piezoelectric cantilevers 21 become inclined. Thus, it is possible to make the thickness of the wirings 34, 36-1 and 36-2 formed on the upper surfaces of the first insulating elements 31-1, 31-2 and 31-3 uniform. Therefore, it is possible to improve reliability of electrical coupling between the first upper electrode 63 and the wiring 18 which are electrically coupled by the wiring 34 as well as reliability of electrical coupling between the first upper electrodes 63 and the wirings 26 which are electrically coupled by the wirings 36-1 and 36-2.

The first piezoelectric cantilevers 22 include first lower electrodes 65, first piezoelectric bodies 66 and first upper electrodes 67. The second lower electrodes 65 are provided on upper surfaces of the second support parts 53. The second lower electrodes 65 are electrically coupled to the pad 13. The width W3 of the second lower electrodes 65 is smaller than the width W4 of the second support parts 53 such that the wirings 26 may be formed on the upper surfaces of the second support parts 53. If the width W4 of the second support parts 53 is 200 micrometers, the width W3 of the second piezoelectric bodies 66 may be 150 micrometers, for example.

The second lower electrodes 65 may be formed of Ti/Pt multilayered films which are formed by successively forming on the upper surface 48A of the SiO2 film 48 Ti films (10 nm of thickness, for example) and Pt films (100 nm of thickness, for example), for example.

The second piezoelectric bodies 66 are provided on the upper surfaces 65A of the second lower electrodes 65. The material of the second piezoelectric bodies 66 may be a PZT (zircon acid lead titanium), for example. The second piezoelectric bodies 66 may be PZT films (thickness of 2 micrometers, for example), for example.

The second upper electrodes 67 are provided on the upper surfaces 66A of the second piezoelectric bodies 66. The second upper electrodes 67 are electrically coupled to the pad 14. The second upper electrodes 67 may be formed of Ti/Pt multilayered films which are formed by successively forming on the upper surfaces 66A of the second piezoelectric bodies 66 Ti films (10 nm of thickness, for example) and Pt films (100 nm of thickness, for example), for example.

The second piezoelectric cantilevers 22 have sides which have inclined surfaces such that the width of the second piezoelectric cantilevers 22 increases when viewed from the second upper electrodes 67 to the second lower electrodes 65. The angle of inclination of the sides of the second piezoelectric cantilevers 22 may be 30 degrees, for example.

When the second piezoelectric cantilevers 22 have sides with such inclined surfaces, the upper surfaces of the second insulating elements 32-1, 32- and 32-3 disposed on the second piezoelectric cantilevers 22 become inclined. Thus, it is possible to make the thickness of the wirings 35, 37-1 and 37-2 formed on the upper surfaces of the second insulating elements 32-1, 32-2 and 32-3 uniform. Therefore, it is possible to improve reliability of electrical coupling between the second upper electrode 67 and the wiring 19 which are electrically coupled by the wirings 35 as well as reliability of electrical coupling between the second upper electrodes 67 and the wirings 27 which are electrically coupled by the wirings 37-1 and 37-2.

The wirings 25-1 are provided such that it extends over from the upper surfaces of the third support parts 54 to parts of the upper surfaces of the first and second support parts 52 and 53 which are coupled to the third support parts 54. Each wiring 25-1 has one end portion coupled to the corresponding first lower electrode 61 and another end portion coupled to the corresponding second lower electrode 65. In this way, the wirings 25-1 electrically couple the first lower electrodes 61 and the second lower electrodes 65. The wirings 25-1 are formed integrally with the first and second lower electrodes 61 and 65. The width of the wirings 25-1 may be 150 micrometers, for example.

The wirings 25-1 are provided such that it extends over from the upper surfaces of the third support parts 55 to parts of the upper surfaces of the first and second support parts 52 and 53 which are coupled to the third support parts 55. Each wiring 25-2 has one end portion coupled to the corresponding second lower electrode 65 and another end portion coupled to the corresponding first lower electrode 61. In this way, the wirings 25-2 electrically couple the first lower electrodes 61 and the second lower electrodes 65. The wirings 25-2 are formed integrally with the first and second lower electrodes 61 and 65. The width of the wirings 25-2 may be 150 micrometers, for example.

The wirings 26 are provided on the first, second and third support parts 52-55 such that they extend along the wirings 25-1, 25-2 and the second lower electrodes 65. Each wiring 26 includes a first coupling part 71 provided near the end portion of one of two first piezoelectric cantilevers 21 which are adjacent to each second piezoelectric cantilever 22; and a second coupling part 72 provided near the end portion of another first piezoelectric cantilever 21. The first coupling parts 71 are provided on parts of the upper surfaces of the first support part 52 which are disposed near the third support parts 54. The second coupling parts 72 are provided on the upper surfaces of the third support parts 55.

The first coupling parts 71 are coupled to the wirings 36-1 which in turn are coupled to first upper electrodes 63. The second coupling parts 72 are coupled to the wirings 36-2 which in turn are coupled to first upper electrodes 63. The wirings 26 electrically couple the first upper electrodes 63 via the wirings 36-1 and 36-2. The width of the wirings 26 not including the first and second coupling parts 71 and 72 may be 15 micrometers, for example. The first and second coupling parts 71 and 72 are wider than the remaining part of the wirings 26.

The wirings 27 are provided on the first, second and third support parts 52-55 such that they extend along the wirings 25-1, 25-2 and the first lower electrodes 61. Each wiring 27 includes a first coupling part 74 provided near the end portion of one of two second piezoelectric cantilevers 22 which are adjacent to each first piezoelectric cantilever 21; and a second coupling part 75 provided near the end portion of another second piezoelectric cantilever 22. The first coupling parts 74 are provided on parts of the upper surfaces of the second support part 53 which are disposed near the third support parts 55. The second coupling parts 75 are provided on the upper surfaces of the third support parts 54.

The first coupling parts 74 are coupled to the wirings 37-1 which in turn are coupled to second upper electrodes 67. The second coupling parts 75 are coupled to the wirings 37-2 which in turn are coupled to second upper electrodes 67. The wirings electrically couple the second upper electrodes 67 via the wirings 37. The width of the wirings 27 not including the first and second coupling parts 74 and 75 may be 15 micrometers, for example. The first and second coupling parts 74 and 75 are wider than the remaining part of the wirings 27.

The wirings 25-1, 25-2, 26 and 27 may be formed of the same metal films as is the case with the first and second lower electrodes 61 and 65, for example. Specifically, the wirings 25-1, 25-2, 26 and 27 may be formed of Ti/Pt multilayered films which are formed by successively forming Ti films (10 nm of thickness, for example) and Pt films (100 nm of thickness, for example), for example.

In this way, since the wirings 26 are formed of the metal films, components of the wirings 26 no longer include the piezoelectric material used for the first and second piezoelectric bodies 62 and 66. This prevents the wiring 26 from canceling a part of the displacement of the second piezoelectric body 66, and thus can prevent the reduction of the bending efficiency of the piezoelectric actuator 10 due to the wiring 26 provided on the support body 42.

Further, since the wirings 27 are formed of the metal films, components of the wirings 27 no longer include the piezoelectric material used for the first and second piezoelectric bodies 62 and 66. This prevents the wirings 27 from canceling a part of the displacement of the first piezoelectric body 62, and thus can prevent the reduction of the bending efficiency of the piezoelectric actuator 10 due to the wirings 27 provided on the support body 42.

The first insulating element 31-1 is provided such that it covers the side of the first piezoelectric cantilever 21 located near another end portion of the wiring 18 and extends from the end portion of the first upper electrode 63 to another end portion of the wiring 18. The upper surface of the first insulating element 31-1 is gently inclined. The first insulating element 31-1 prevents the wiring 34 formed on the upper surface of the first insulating element 31-1 from being electrically coupled to the first lower electrode 61.

The first insulating elements 31-2 are provided such that they cover parts of the sides of the first piezoelectric cantilevers 21 located near the first coupling parts 71 and extend from the first upper electrodes 63 to the first coupling parts 71. The upper surfaces of the first insulating elements 31-2 are gently inclined. The first insulating elements 31-2 prevent the wirings 36-1 formed on the upper surfaces of the first insulating elements 31-2 from being electrically coupled to the first lower electrodes 61.

The first insulating elements 31-3 are provided such that they cover the sides of the first piezoelectric cantilevers 21 located near the second coupling parts 72 and extend from the first upper electrodes 63 to the second coupling parts 72. The upper surfaces of the first insulating elements 31-3 are gently inclined. The first insulating elements 31-3 prevent the wirings 36-2 formed on the upper surfaces of the first insulating elements 31-3 from being electrically coupled to the first lower electrodes 61.

The first insulating elements 31-1, 31-2 and 31-3 may be formed from a photosensitive resin, for example.

The second insulating element 32-1 is provided such that it covers the side of the second piezoelectric cantilever 22 located near another end portion of the wiring 19 and extends from the end portion of the second upper electrode 67 to another end portion of the wiring 19. The upper surface of the second insulating element 32-1 is gently inclined. The second insulating element 32-1 prevents the wiring 35 formed on the upper surface of the second insulating element 32-1 from being electrically coupled to the second lower electrode 65.

The second insulating elements 32-2 are provided such that they cover the sides of the second piezoelectric cantilevers 22 located near the first coupling parts 74 and extend from the second upper electrodes 67 to the first coupling parts 74. The upper surfaces of the second insulating elements 32-2 are gently inclined. The second insulating elements 32-2 prevent the wirings 37-1 formed on the upper surfaces of the second insulating elements 32-2 from being electrically coupled to the second lower electrodes 67.

The second insulating elements 32-3 are provided such that they cover the sides of the second piezoelectric cantilevers 22 located near the second coupling parts 75 and extend from the second upper electrodes 67 to the second coupling parts 75. The upper surfaces of the second insulating elements 32-3 are gently inclined. The second insulating elements 32-3 prevent the wirings 36-2 formed on the upper surfaces of the second insulating elements 32-3 from being electrically coupled to the second lower electrodes 65.

The second insulating elements 32-1, 32-2 and 32-3 may be formed from a photosensitive resin, for example.

The wiring 34 is provided on the upper surface of the first insulating element 31-1. The wiring 34 has one end portion coupled to the upper surface of the wiring 18 and another end portion coupled to the upper surface of the first upper electrode 63. In this way, the wiring 34 electrically couples the wiring 18 coupled to the pad 14 and the first upper electrodes 63.

The wiring 35 is provided on the upper surface of the second insulating element 32-1. The wiring 35 has one end portion coupled to the upper surface of the wiring 19 and another end portion coupled to the upper surface of the second upper electrode 67. In this way, the wiring 35 electrically couples the wiring 19 coupled to the pad 15 and the second upper electrodes 67.

The wirings 36-1 are provided on the upper surfaces of the first insulating elements 31-2. Each wiring 36-1 has one end portion coupled to the upper surface of the corresponding first coupling part 71 and another end portion coupled to the upper surface of the corresponding first upper electrode 63. In this way, the wirings 36-1 electrically couple the wiring 19 coupled to the pad 15 and the first upper electrodes 63.

The wirings 36-2 are provided on the upper surfaces of the first insulating elements 31-3. Each wiring 36-2 has one end portion coupled to the upper surface of the corresponding second coupling part 72 and another end portion coupled to the upper surface of the corresponding first upper electrode 63. In this way, the wirings 36-2 electrically couple the first upper electrodes 63 via the wirings 26 and 36-1.

The wirings 36-1 and 36-2 electrically couple the first upper electrodes 63 via the wirings 26.

The wirings 37-1 are provided on the upper surfaces of the second insulating element 32-2. Each wiring 37-1 has one end portion coupled to the upper surface of the corresponding first coupling part 74 and another end portion coupled to the upper surface of the corresponding second upper electrode 67. In this way, the wirings 37-1 electrically couple the wirings 27 and the second upper electrodes 67.

The wirings 37-2 are provided on the upper surfaces of the second insulating elements 32-3. Each wiring 37-2 has one end portion coupled to the upper surface of the corresponding second coupling part 75 and another end portion coupled to the upper surface of the corresponding second upper electrode 67. In this way, the wirings 37-2 electrically couple the second upper electrodes 67 via the wirings 27 and 37-1.

The wirings 37-1 and 37-2 electrically couple the second upper electrodes 67 via the wirings 27.

The wirings 34, 35, 36-1, 36-2, 37-1 and 37-2 may be formed of Ti/Ni/Au multilayered films or Al films (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

By using the Ti/Ni/Au multilayered films or Al films to form the wirings 34, 35, 36-1, 36-2, 37-1 and 37-2, it is possible to reduce resistance values of the wirings 34, 35, 36-1, 36-2, 37-1 and 37-2.

According to the piezoelectric actuator of the first embodiment, since the wirings 26 on the upper surface of the support body 42, which are electrically coupled to the first upper electrodes provided on the first support parts 52, the wirings 19 and 27 on the upper surface of the support body 42, which are electrically coupled to the second upper electrodes 67 provided on the second support parts 53 are formed of the metal films, components of the wirings 19, 26 and 27 no longer include the piezoelectric material, which prevents the reduction of the bending efficiency of the piezoelectric actuator 10 due to the wirings 19, 26 and 27.

FIGS. 5-17 are drawings illustrating a manufacturing process of the piezoelectric actuator according to the first embodiment of the present invention. In FIGS. 5-17, the same elements as those of the piezoelectric actuator 10 of the first embodiment are referred to by the same numerals.

With reference to FIGS. 5-17, the manufacturing process of the piezoelectric actuator 10 according to the first embodiment is described.

Figure 5:
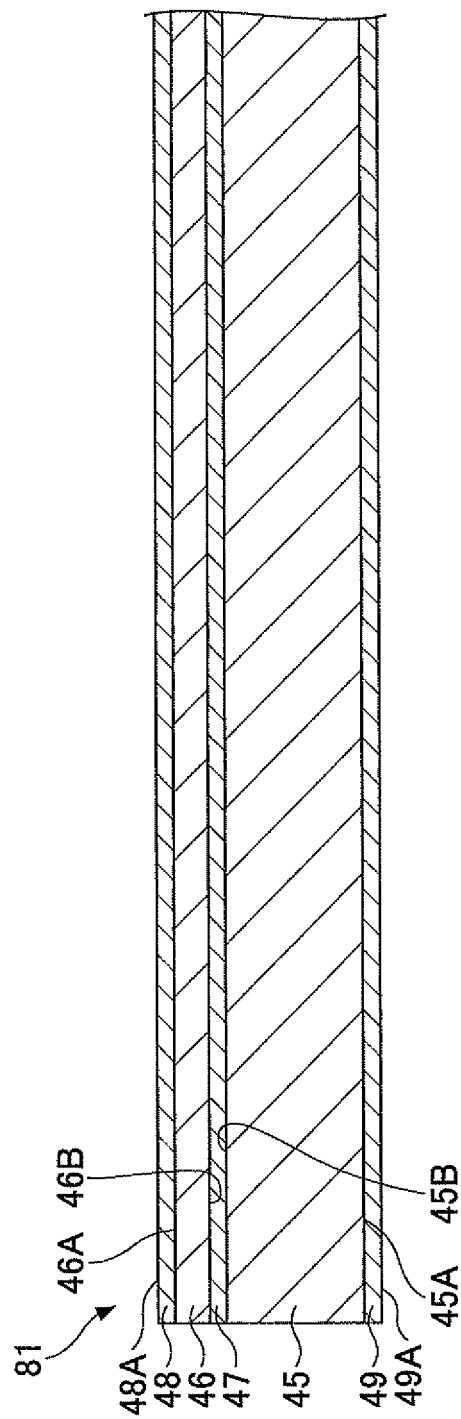
FIG. 5 is a drawing illustrating a manufacturing process (part 1) of the piezoelectric actuator according to the first embodiment of the present invention.

At first, in the process illustrated in FIG. 5, a substrate 81 is prepared as a base material for the support member 11. The substrate may be SOI (Silicon on Insulator) wafer which includes a first silicon substrate 45 (thickness of 470 micrometers, for example); a second silicon substrate 46 (thickness of 30 micrometers, for example); a $SiO_2$ film 47 (thickness of 0.5 micrometers, for example) formed between the first and second silicon substrates 45 and 46; a $SiO_2$ film (thickness of 0.5 micrometers, for example) formed on an upper surface 46A of the second silicon substrate 46; and a $SiO_2$ film 49 (thickness of 0.5 micrometers, for example) formed on a lower surface 45A of the first silicon substrate 45.

Figure 6:
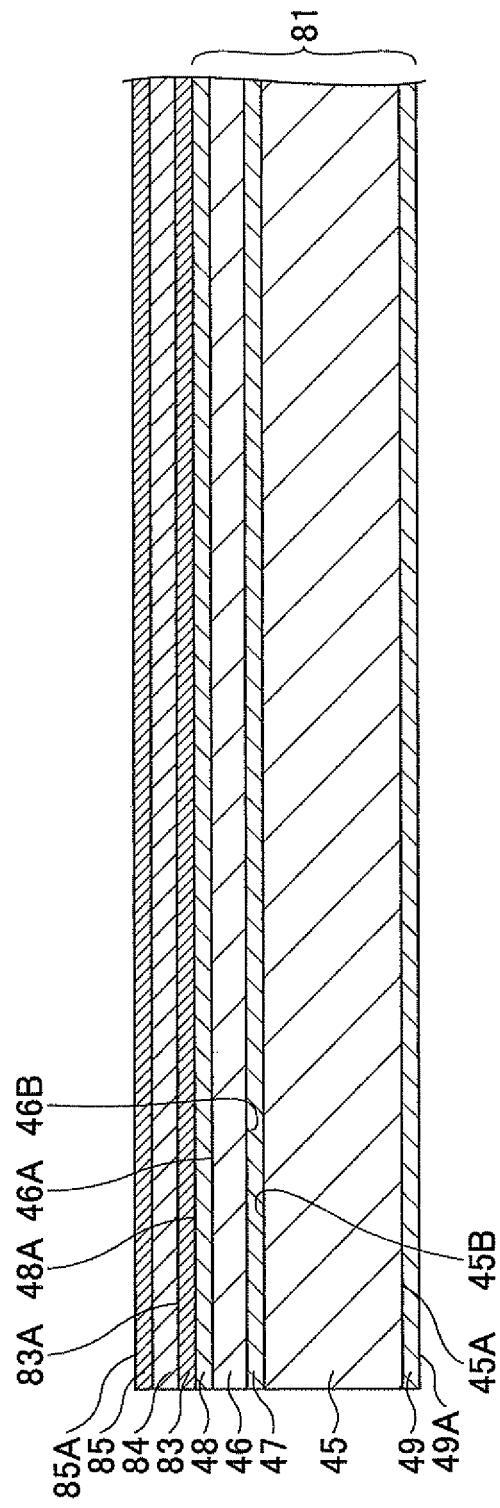
FIG. 6 is a drawing illustrating a manufacturing process (part 2) of the piezoelectric actuator according to the first embodiment of the present invention.

Next, in the process illustrated in FIG. 6, a first metal layer 83 as a base material for the first and second lower electrodes 61 and 65, a dielectric layer 84 as a base material for the first and second piezoelectric bodies 62 and 66, and a second metal layer 85 as a base material for the first and second upper electrodes 63 and 67 are formed successively on the upper surface 48A of the $SiO_2$ film 48 provided on the substrate 81 (a piezoelectric cantilever base material forming process).

The first and second metal layers 83 and 85 are formed by a sputtering process, for example. The first and second metal layers 83 and 85 may be formed of Ti/Pt multilayered films which are formed by successively forming Ti films (10 nm of thickness, for example) and Pt films (100 nm of thickness, for example), for example. The dielectric layer 84 may be a PZT film (thickness of 2 micrometers, for example), for example. The PZT film may be formed by a sol-gel process, which is also referred to as CSD (Chemical Solution Deposition) process. The sol-gel process requires a low-cost apparatus and thus reduces the manufacturing cost. Further, the PZT film may be formed by a sputtering process.

Figure 7:
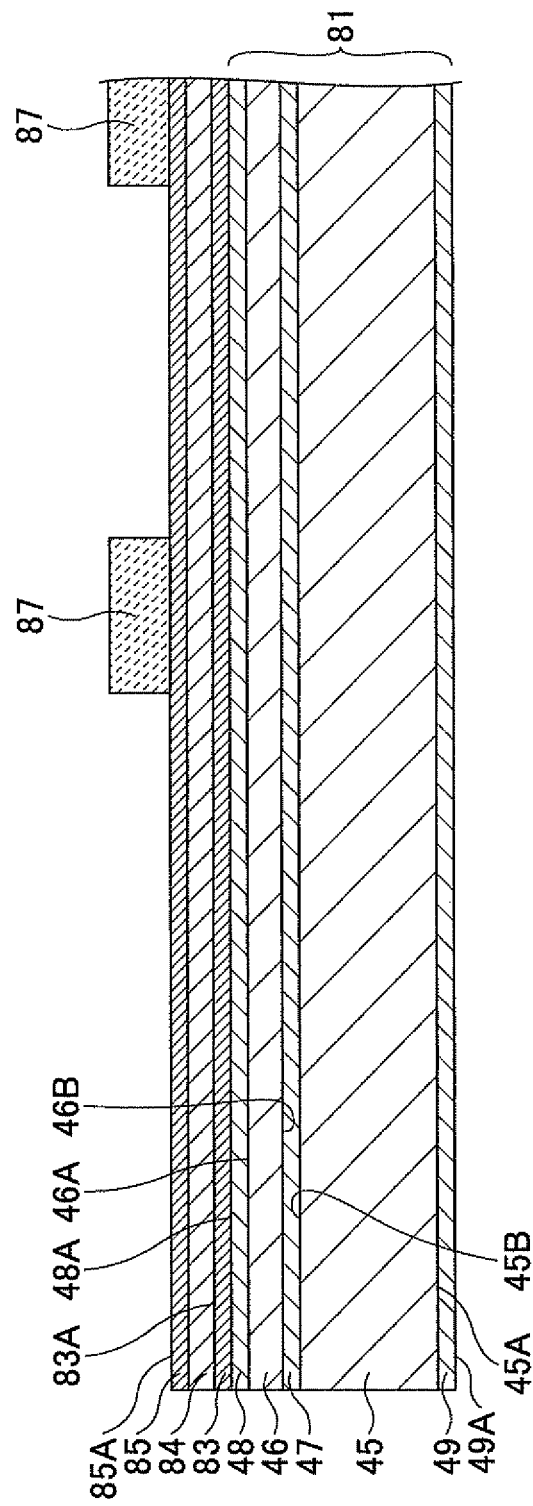
FIG. 7 is a drawing illustrating a manufacturing process (part 3) of the piezoelectric actuator according to the first embodiment of the present invention.

Next, in the process illustrated in FIG. 7, resist films 87 for etching are formed such that they cover parts of the upper surface 85A of the second metal layer 85 which correspond to areas for forming the first and second piezoelectric cantilevers 21 and 22.

Figure 8:
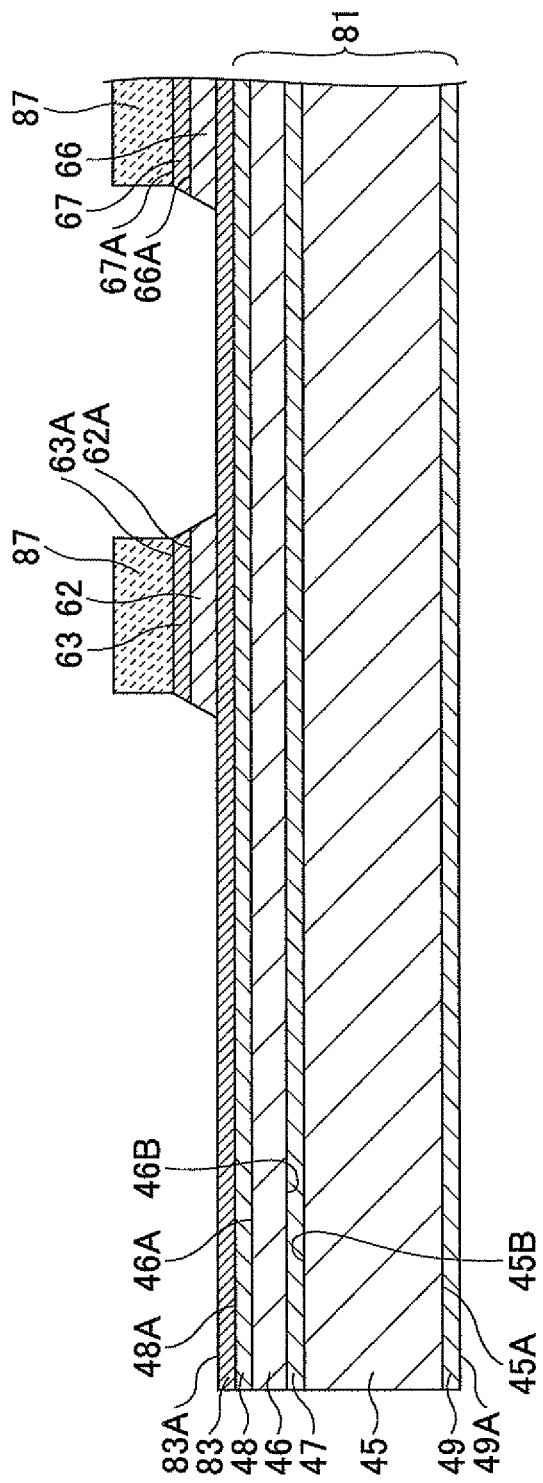
FIG. 8 is a drawing illustrating a manufacturing process (part 4) of the piezoelectric actuator according to the first embodiment of the present invention.

Next, in the process illustrated in FIG. 8, the first and second upper electrodes 63 and 67, and the first and second piezoelectric bodies 62 and 66 are formed simultaneously by etching, by means of an anisotropic etching process (a dry etching process, for example) using the resist films 87 as masks, parts of the dielectric layer 84 and the second metal layer 85 exposed out of the resist films 87 until the upper surface 83A of the first metal layer 83 is exposed (an upper electrode/piezoelectric body forming process).

At that time, the etching process is performed such that sides of a structure of the first upper electrode 63 and the first piezoelectric body 62 and sides of a structure of the second upper electrode 67 and the second piezoelectric body 66 have inclined surfaces such that the widths of structures increase when viewed from the resist films 87 to the first metal layer 83 (The angle of inclination is 30 degrees, for example).

Specifically, the etching process is performed under such an etching condition that there is no deposit on the sides of a structure of the first upper electrode 63 and the first piezoelectric body 62 and the sides of a structure of the second upper electrode 67 and the second piezoelectric body 66, for example.

Figure 9:
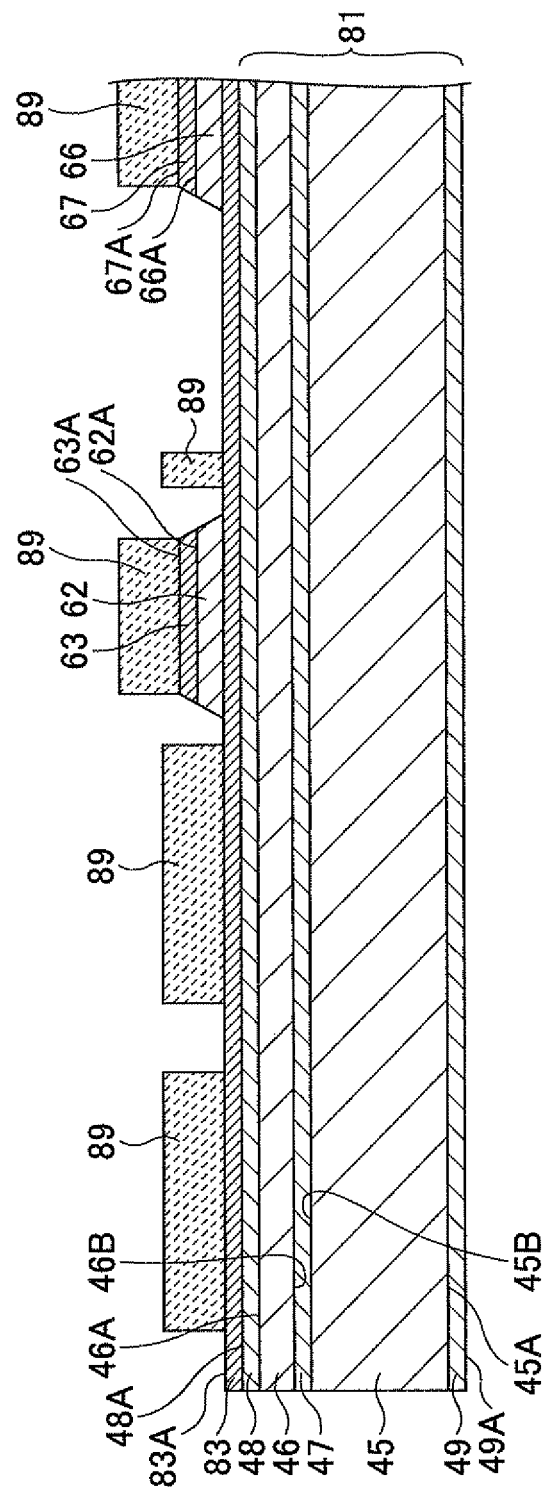
FIG. 9 is a drawing illustrating a manufacturing process (part 5) of the piezoelectric actuator according to the first embodiment of the present invention.

Next, in the process illustrated in FIG. 9, the resist films 84 illustrated in FIG. 8 are removed, and then resist films 89 for etching are formed such that they cover the upper surfaces 63A and 67A of the first and second upper electrodes 63 and 67 and respective parts of the upper surface 83A of the first metal layer 83 which are associated with areas for forming the pads 13-15, wirings 17-19, 25-1, 25-2, 26 and 27.

Figure 10:
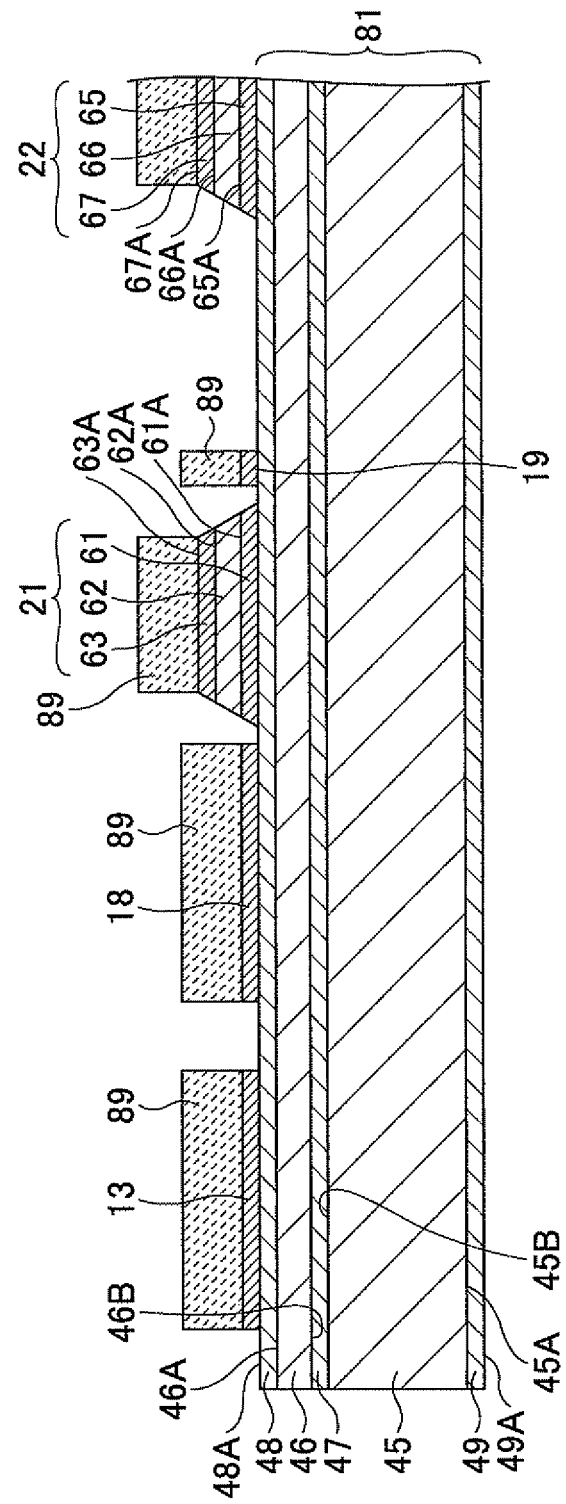
FIG. 10 is a drawing illustrating a manufacturing process (part 6) of the piezoelectric actuator according to the first embodiment of the present invention.

Next, in the process illustrated in FIG. 10, the first and second lower electrodes 61 and 65, and the pads 13-15, wirings 17-19, 25-1, 25-2, 26 and 27 are formed simultaneously by etching, by means of an anisotropic etching process (a dry etching process, for example) using the resist films 89 as masks, parts of the first metal layer 83 exposed out of the resist films 89 until the upper surface 48A of the $SiO_2$ film 48 is exposed (a lower electrode/wiring forming process). It is noted that in FIGS. 10-17, the illustrations of pads 14 and 15 and the wirings 17, 25-1, 25-2, 26 and 27 are omitted because they are difficult to be illustrated in these drawings.

In this way, since the wirings 17-19, 25-1, 25-2, 26 and 27 are formed by patterning the first metal layer 83 (for example, a Ti/Pt multilayered film formed by successively forming a Ti films (10 nm of thickness, for example) and a Pt film (100 nm of thickness, for example) as a base material for the first and second lower electrodes 61 and 65, components of the wirings 19, 26 and 27 no longer include the piezoelectric material (i.e., the dielectric layer 84 as a base material for the first and second piezoelectric bodies 62 and 66), which prevents the reduction of the bending efficiency of the piezoelectric actuator 10 due to the wirings 19, 26 and 27.

It is noted that since the sides of a structure of the first upper electrode 63 and the first piezoelectric body 62 and the sides of a structure of the second upper electrode 67 and the second piezoelectric body 66 have inclined surfaces (on which deposits are formed) such that the widths of structures increase when viewed from the resist films 87 to the first metal layer 83, the sides of the first and second lower electrodes 61 and 65 also become inclined when the lower electrode/wiring forming process is performed.

Figure 11:
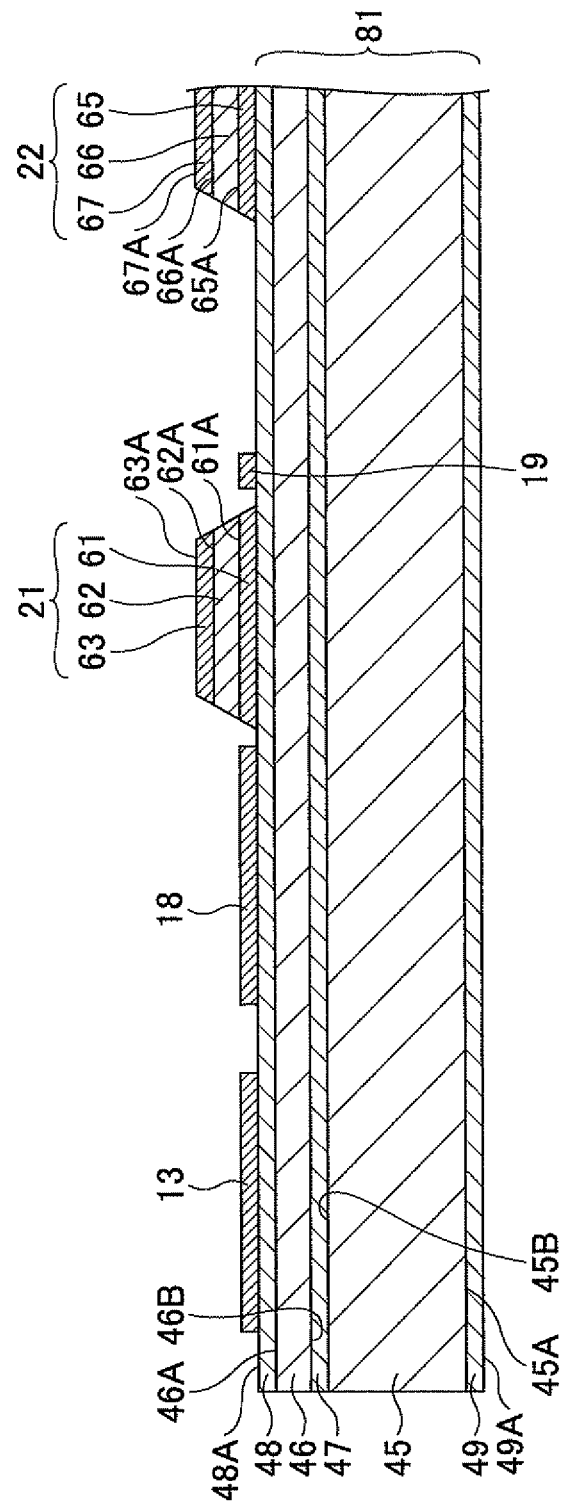
FIG. 11 is a drawing illustrating a manufacturing process (part 7) of the piezoelectric actuator according to the first embodiment of the present invention.

Next, in the process illustrated in FIG. 11, the resist films 89 illustrated in FIG. 10 are removed.

Figure 12:
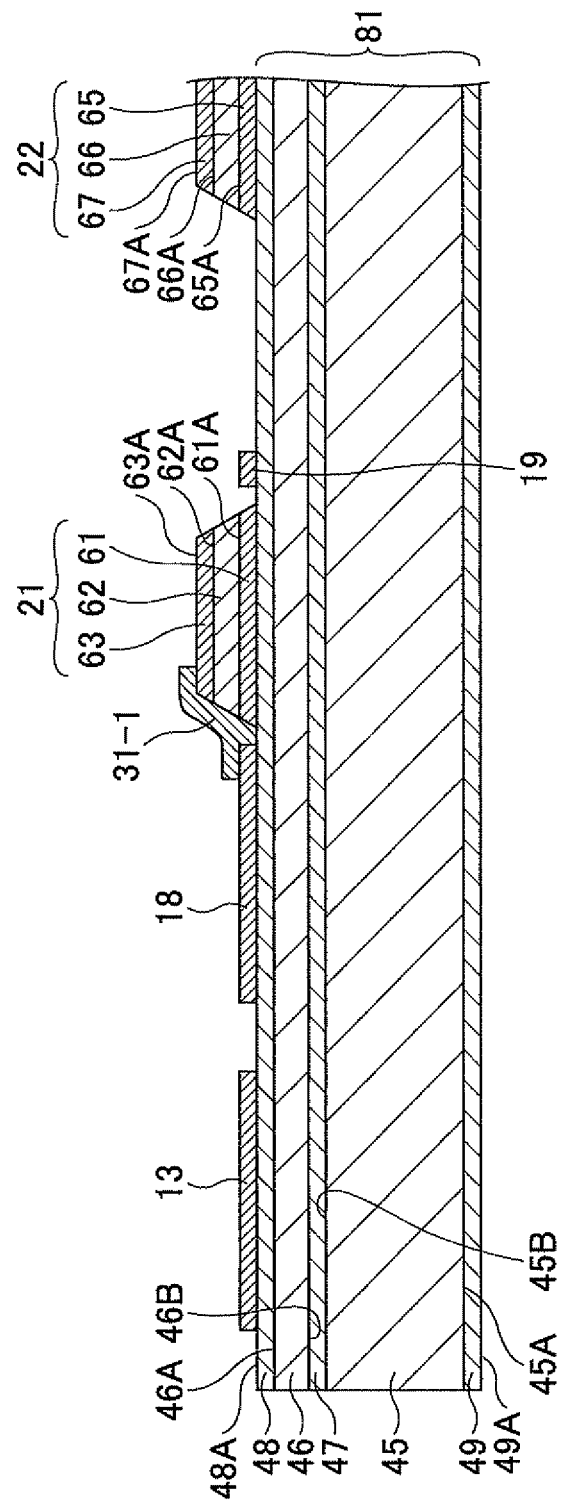
FIG. 12 is a drawing illustrating a manufacturing process (part 8) of the piezoelectric actuator according to the first embodiment of the present invention.

Next, in the process illustrated in FIG. 12, the first insulating elements 31-1, 31-2 and 31-3, and the second insulating elements 32-1, 32-2 and 32-3 are formed simultaneously (an insulating element forming process). It is noted that in FIGS. 10-17, the illustrations of first insulating elements 31-2 and 31-3 and the second insulating elements 32-1, 32-2 and 32-3 are omitted because they are difficult to be illustrated in these drawings.

Specifically, the first insulating elements 31-1, 31-2 and 31-3, and the second insulating elements 32-1, 32-2 and 32-3 are formed simultaneously by applying a photosensitive resin (a photosensitive resist, for example) on the structure illustrated in FIG. 11, subjecting the photosensitive resin to the exposure to light for a developing process, and then thermosetting the photosensitive resin.

The first insulating element 31-1 is formed such that it covers the side of the first piezoelectric cantilever 21 located near another end portion of the wiring 18 and extends from the end portion of the first upper electrode 63 to another end portion of the wiring 18. The first insulating elements 31-2 are formed such that they cover the sides of the first piezoelectric cantilevers 21 located near the first coupling parts 71 and extend from the first upper electrodes 63 to the first coupling parts 71.

The first insulating elements 31-3 are formed such that they cover the sides of the first piezoelectric cantilevers 21 located near the second coupling parts 72 and extend from the first upper electrodes 63 to the second coupling parts 72. The second insulating element 32-1 is formed such that it covers the side of the second piezoelectric cantilever 22 located near another end portion of the wiring 19 and extends from the end portion of the second upper electrode 67 to another end portion of the wiring 19.

The second insulating elements 32-2 are formed such that they cover the sides of the second piezoelectric cantilevers 22 located near the first coupling parts 74 and extend from the second upper electrodes 67 to the first coupling parts 74. The second insulating elements 31-3 are formed such that they cover the sides of the second piezoelectric cantilevers 22 located near the second coupling parts 75 and extend from the second upper electrodes 67 to the second coupling parts 75.

As described above, since the first insulating elements 31-1, 31-2 and 31-3, and the second insulating elements 32-1, 32-2 and 32-3 are formed using a photosensitive resin (a photosensitive resist, for example), the first insulating elements 31-1, 31-2 and 31-3, and the second insulating elements 32-1, 32-2 and 32-3 can be formed at low cost, which enables reduction of the manufacturing cost of the piezoelectric actuator 10.

Further, since the first insulating elements 31-1, 31-2 and 31-3, and the second insulating elements 32-1, 32-2 and 32-3 are formed using a photosensitive resin (a photosensitive resist, for example), the upper surfaces of the first insulating elements 31-1, 31-2 and 31-3 and the second insulating elements 32-1, 32-2 and 32-3, on which the wirings 34, 35, 36-1, 36-2, 37-1 and 37-2 are formed, become gently inclined, which enables making the thickness of the wirings 34, 35, 36-1, 36-2, 37-1 and 37-2 uniform.

Therefore, it is possible to improve reliability of electrical coupling between the first upper electrodes 63 and the wirings 18 and 26 which are electrically coupled by the wirings 34, 36-1 and 36-2 as well as reliability of electrical coupling between the second upper electrodes 67 and the wirings 19 and 27 which are electrically coupled by the wirings 35, 37-1 and 37-2.

Figure 13:
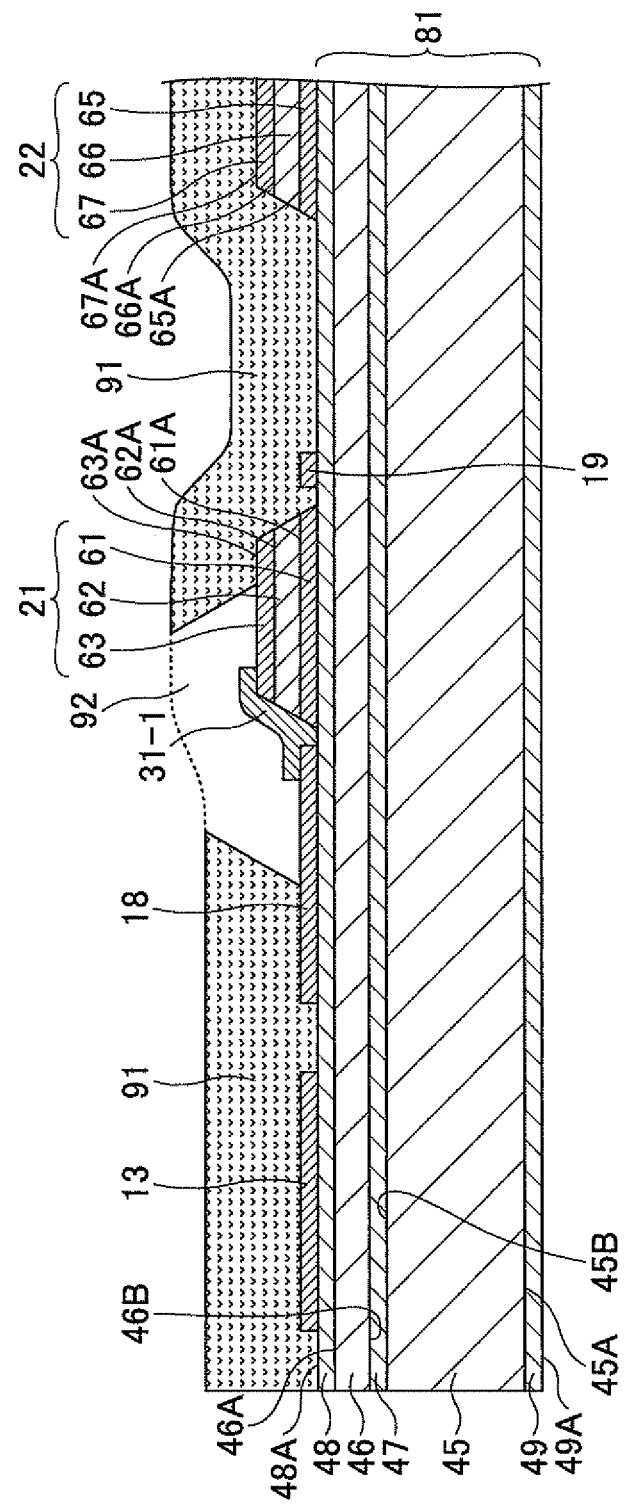
FIG. 13 is a drawing illustrating a manufacturing process (part 9) of the piezoelectric actuator according to the first embodiment of the present invention.

Next, in the process illustrated in FIG. 13, a resist film 91 for lift-off which has openings 92 is formed on the structure illustrated in FIG. 12. The openings 92 are provided for exposing parts of the first insulating elements 31-1, 31-2 and 31-3, the second insulating elements 32-1, 32-2 and 32-3, the first coupling parts 71 and 74 and the second coupling parts 72 and 75 associated with areas for forming the wires 34, 35, 36-1, 36-2, 37-1 and 37-2.

Parts of the resist film 91 associated with the sides of the openings 92 have cross-sections of a reverse tapered shape. In other words, the width of the openings 92 increases when viewed from the upper surface to the lower surface of the resist film 91.

Figure 14:
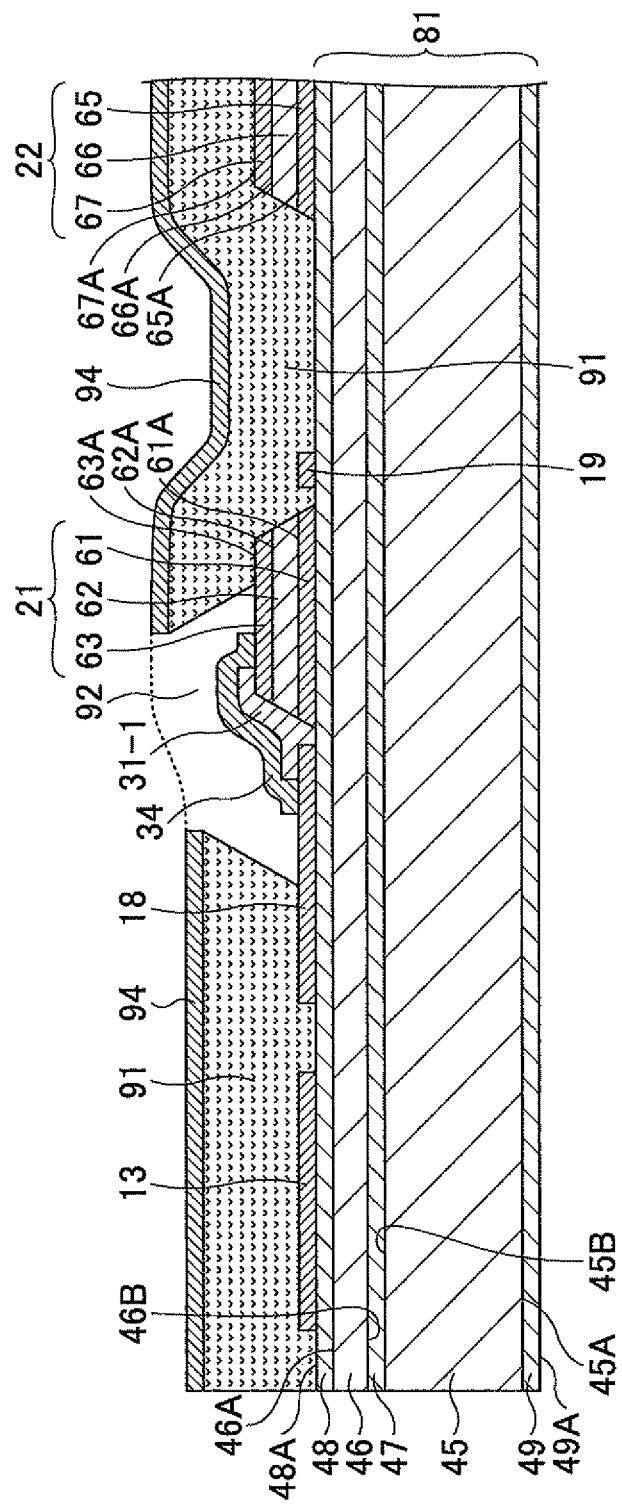
FIG. 14 is a drawing illustrating a manufacturing process (part 10) of the piezoelectric actuator according to the first embodiment of the present invention.

Next, in the process illustrated in FIG. 14, metal films 94 are formed from the upper surface side of the structure illustrated in FIG. 12, thereby the wires 34, 35, 36-1, 36-2, 37-1 and 37-2 are formed by the metal films 94 passing through the openings 92 (a metal film forming process). At that time, unnecessary metal films 94 are formed on the resist film 91.

The metal films 94 from which the wirings 34, 35, 36-1, 36-2, 37-1 and 37-2 are formed may be formed of Ti/Ni/Au multilayered films or Al films (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

By using the Ti/Ni/Au multilayered films or Al films to form the wirings 34, 35, 36-1, 36-2, 37-1 and 37-2, it is possible to reduce resistance values of the wirings 34, 35, 36-1, 36-2, 37-1 and 37-2.

Figure 15:
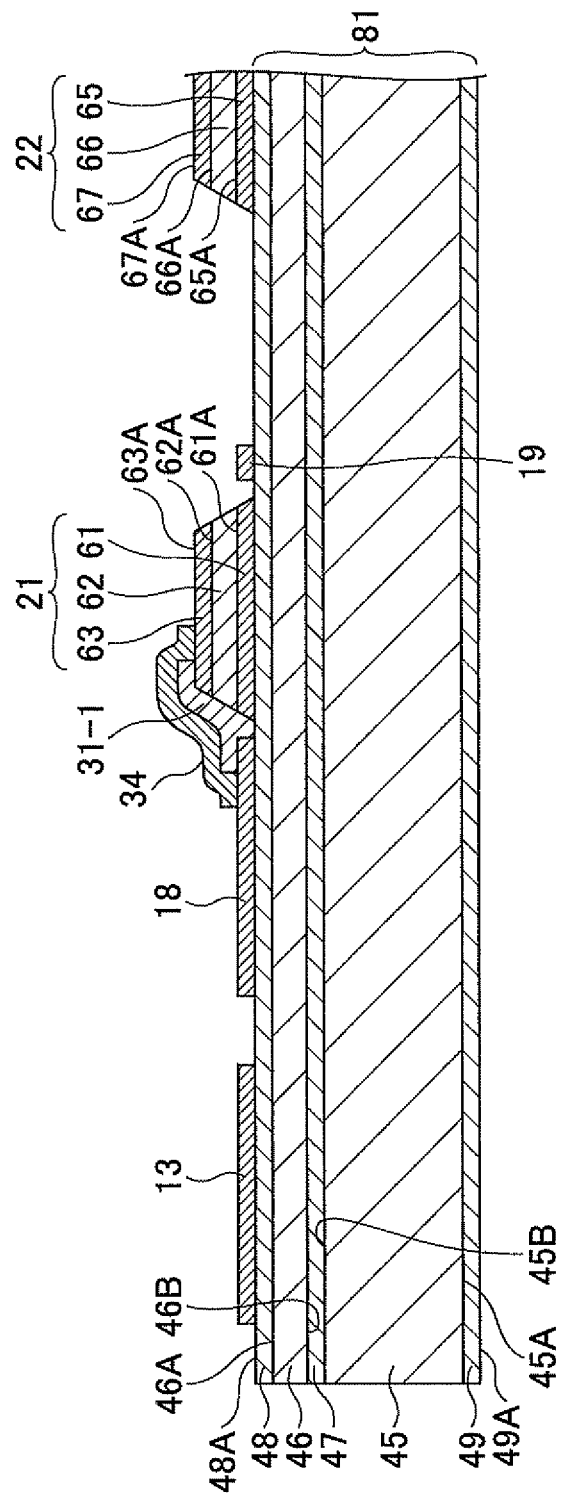
FIG. 15 is a drawing illustrating a manufacturing process (part 11) of the piezoelectric actuator according to the first embodiment of the present invention.

Next, in the process illustrated in FIG. 15, the resist film 91 illustrated in FIG. 14 is removed. In this way, the unnecessary metal films 94 formed on the upper surface of the resist film 91 are removed together with the resist film 91.

Figure 16:
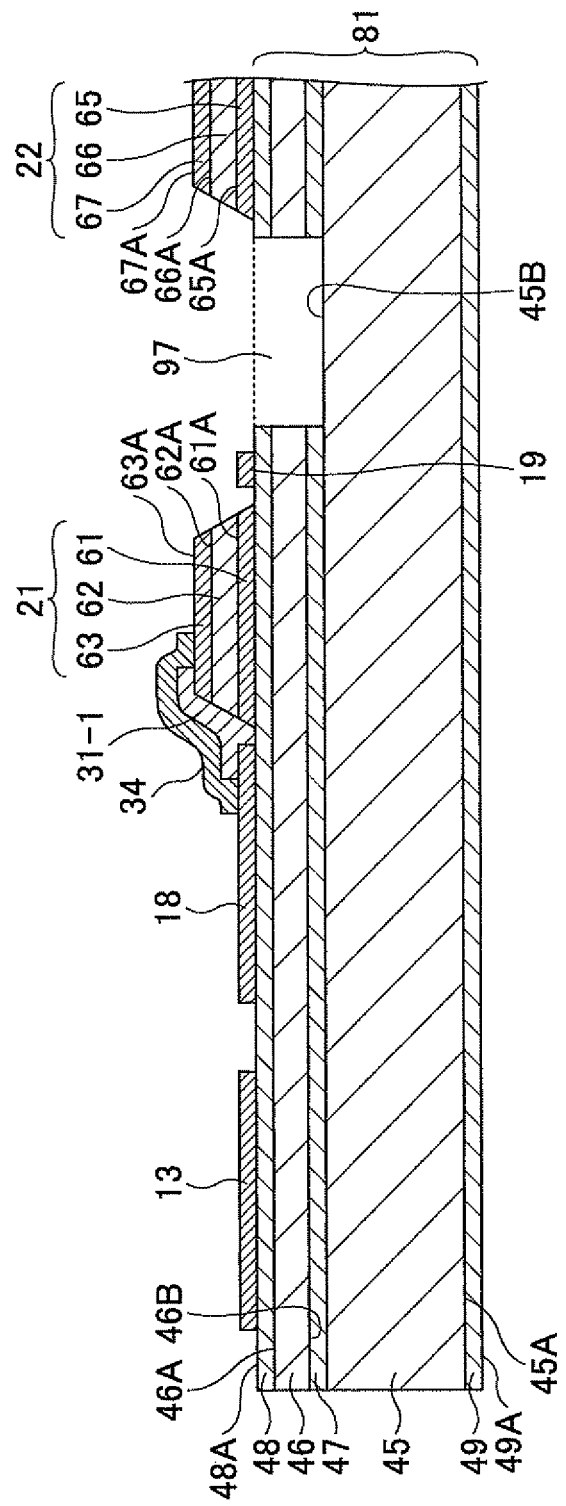
FIG. 16 is a drawing illustrating a manufacturing process (part 12) of the piezoelectric actuator according to the first embodiment of the present invention.

Next, in the process illustrated in FIG. 16, a groove 97 for exposing the upper surface 45B of the first silicon substrate 45 is formed on the substrate 81 by removing parts of the second silicon substrate 46 and the SiO$_2$ films 47 and 48 located between the frame body 41 and the support body 42 as illustrated in FIG. 3 using an etching process.

Specifically, a resist film for etching (not illustrated), which has an opening (not illustrated) for exposing a part of the upper surface 48A of the SiO$_2$ film 48 associated with an area for forming the groove 97, is formed on the structure illustrated in FIG. 15, and the anisotropic etching is performed using the resist film as a mask to form the groove 97. The resist film for etching is removed after the groove 97 has been formed.

Figure 17:
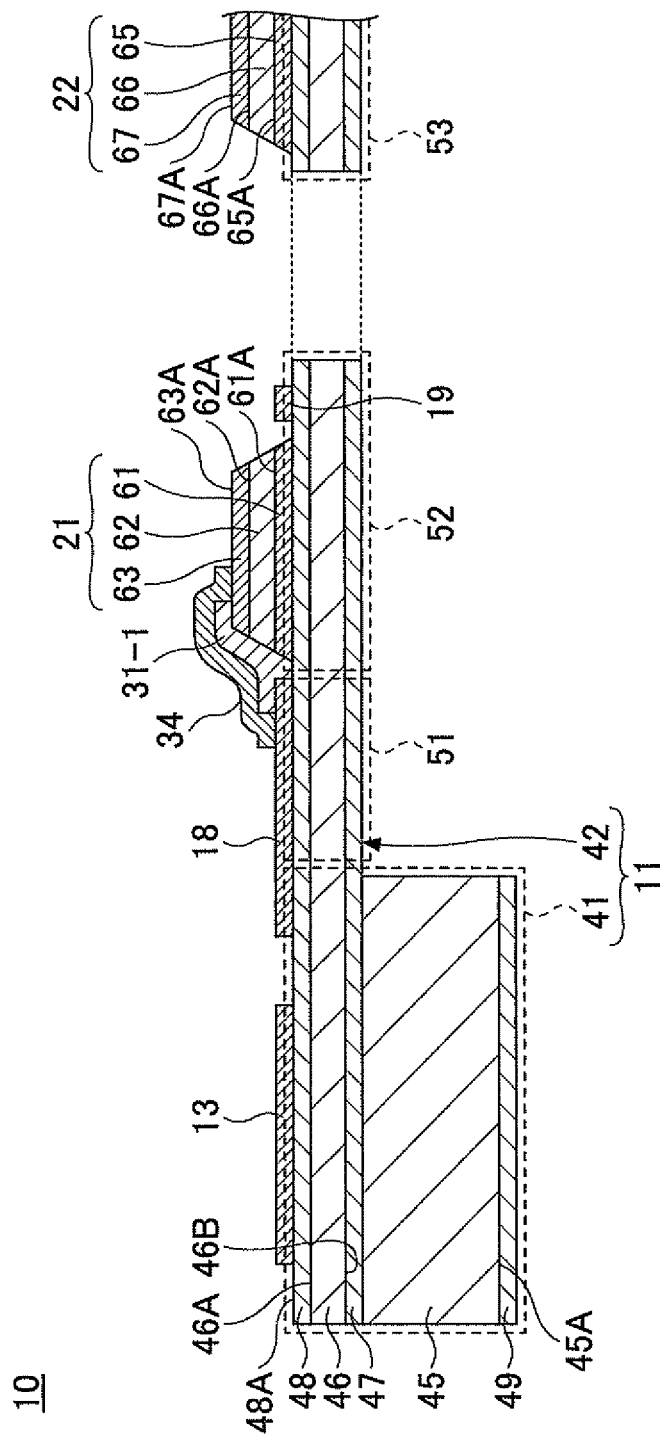
FIG. 17 is a drawing illustrating a manufacturing process (part 13) of the piezoelectric actuator according to the first embodiment of the present invention.

Next, in the process illustrated in FIG. 17, the support member 11 including the frame body 41 and the support body 42 is formed by removing a part of the first silicon substrate 45 and the SiO$_2$ film 49 associated with the frame body 41 from the lower surface side of the structure illustrated in FIG. 16 using an etching process. In this way, the piezoelectric actuator 10 according to the first embodiment is manufactured.

Specifically, a resist film for etching (not illustrated), which has openings (not illustrated) for exposing the lower surface 49A of the SiO$_2$ film 49 associated with areas for forming the groove 97 and the support body 42, is formed on the lower surface side of the structure illustrated in FIG. 16, and parts of the first silicon substrate 45 and the SiO$_2$ film 49 exposed out of the openings (not illustrated) are removed by the anisotropic etching using the resist film as a mask to form the support member 11 including the frame body 41 and the support body 42.

According to the manufacturing process of the piezoelectric actuator of the present embodiment, since the wirings 19, 26 and 27 are formed by patterning the first metal layer 83 (for example, a Ti/Pt multilayered film formed by successively forming a Ti films (10 nm of thickness, for example) and a Pt film (100 nm of thickness, for example) as a base material for the lower electrodes, components of the wirings 19, 26 and 27 no longer include the piezoelectric material (i.e., the dielectric layer as a base material for the first and second piezoelectric bodies 62 and 66), which prevents the reduction of the bending efficiency of the piezoelectric actuator 10 due to the wirings 19, 26 and 27.

According to the piezoelectric actuator 10 of the present embodiment, the pads 13-15 and the wiring 17-19, 25-1, 25-2, 26 and 27 are formed of Ti/Pt multilayered films (i.e., the same films as the first and second lower electrodes 61 and 65) which are formed by successively forming on the upper surface 48A of the SiO2 film 48 Ti films (10 nm of thickness, for example) and Pt films (100 nm of thickness, for example); however, the pads 13-15 and the wiring 17-19, 25-1, 25-2, 26 and 27 may be formed of Ti/Ni/Au multilayered films or Al films (thickness of 100 nanometers, for example) instead of the Ti/Pt multilayered films. In this case, the Ti/Ni/Au multilayered films are formed by successively stacking Ti films (thickness of 25 nanometers, for example), Ni films (thickness of 25 nanometers, for example) and Au films (thickness of 100 nanometers, for example).

In this way, by forming the pads 13-15 and the wiring 17-19, 25-1, 25-2, 26 and 27 of the Ti/Ni/Au multilayered films or Al films, it is possible to prevent the reduction of the bending efficiency of the piezoelectric actuator 10 due to the wirings 19, 26 and 27, and reduce resistance values of the pads 13-15 and the wiring 17-19, 25-1, 25-2, 26 and 27 in comparison with a case in which they are formed of the Ti/Pt multilayered films.

It is noted that a piezoelectric actuator 100 according to a variant of the first embodiment, in which the pads 13-15 and the wiring 17-19, 25-1, 25-2, 26 and 27 are formed of the Ti/Ni/Au multilayered films or the Al films, is described hereinafter.

The piezoelectric actuator 100 is configured as is the case with the piezoelectric actuator 10 according to the first embodiment except that the metal films forming the pads 13-15 and the wiring 17-19, 25-1, 25-2, 26 and 27 of the piezoelectric actuator 100 are different from the metal films forming pads 13-15 and the wiring 17-19, 25-1, 25-2, 26 and 27 of the piezoelectric actuator 10 according to the first embodiment.

FIGS. 18-23 are drawings illustrating a manufacturing process of the piezoelectric actuator according to the variant of the first embodiment of the present invention. In FIGS. 18-23, the same elements as those of the piezoelectric actuator 10 of the first embodiment are referred to by the same numerals.

With reference to FIGS. 18-23, the manufacturing process of the piezoelectric actuator 100 according to the variant of the first embodiment is described.

Figure 18:
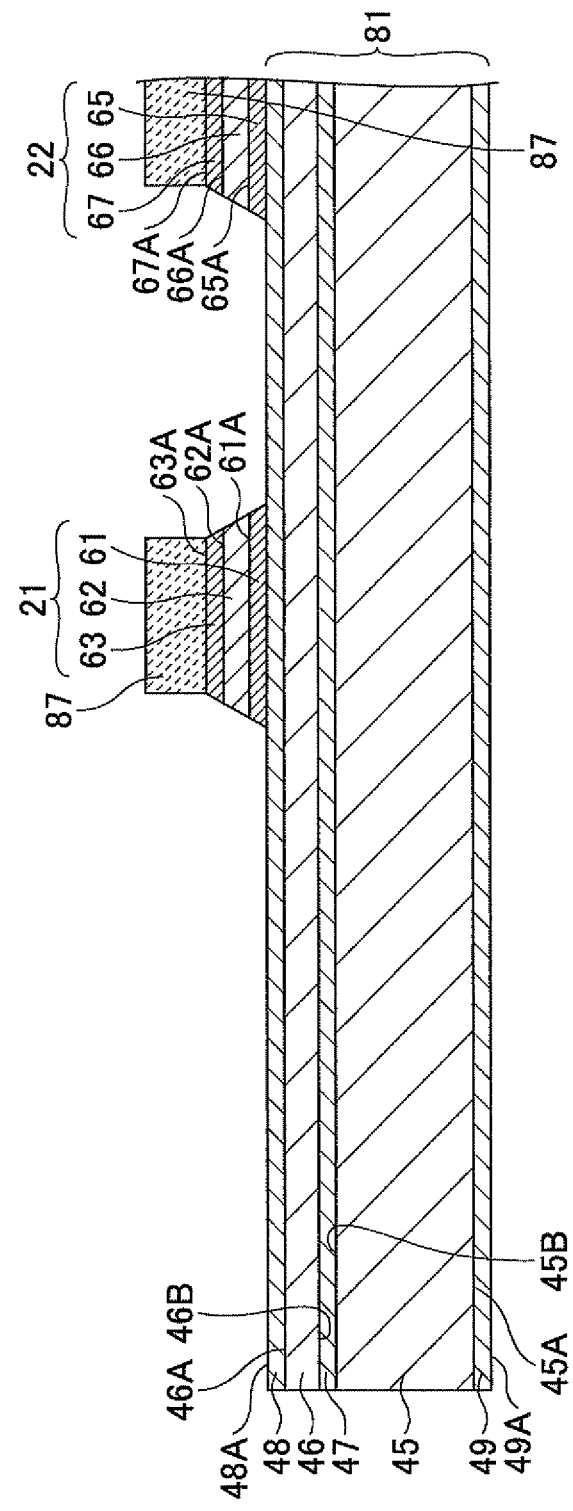
FIG. 18 is a drawing illustrating a manufacturing process (part 1) of the piezoelectric actuator according to a variant of the first embodiment of the present invention.

At first, in the process illustrated in FIG. 18, the same processes as illustrated in FIGS. 3-7 and described above are performed to form the structure illustrated in FIG. 7, and then the first and second piezoelectric cantilevers 21 and 22 which have sides inclined (inclined surfaces) are formed by patterning, by means of an anisotropic etching process (a dry etching process, for example), parts of the first metal layer 83, the dielectric layer 84 and the second metal layer 85 (illustrated in FIG. 7) exposed out of the resist films 87 (a piezoelectric cantilever forming process).

Figure 19:
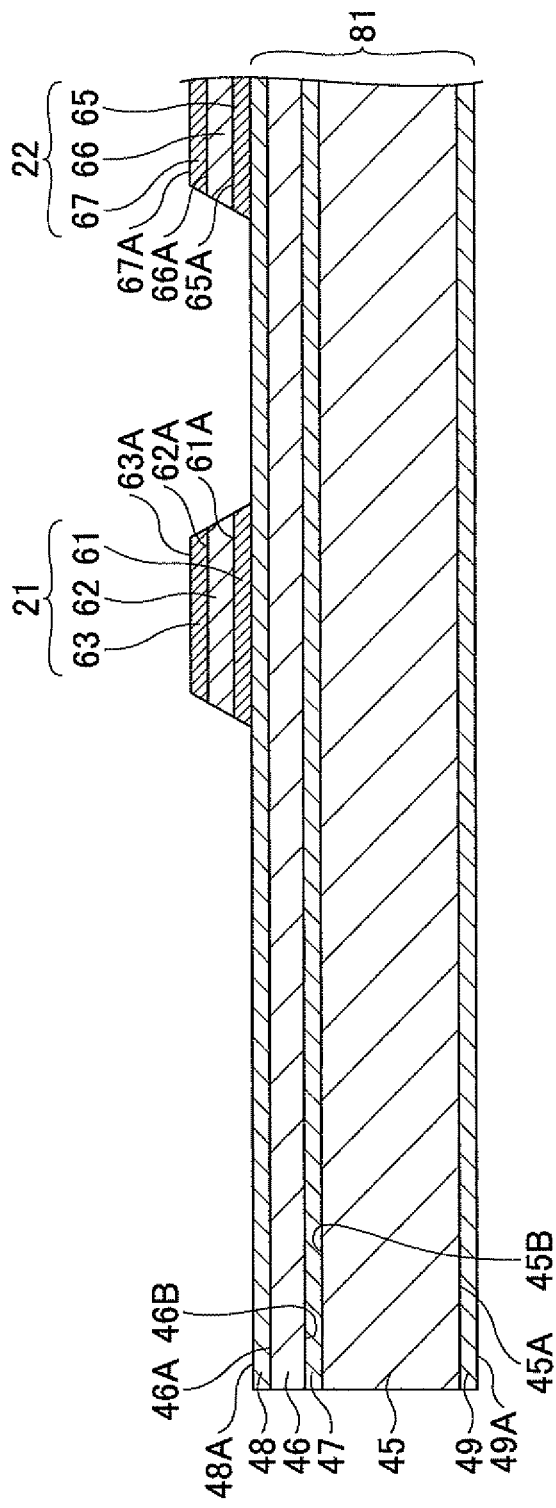
FIG. 19 is a drawing illustrating a manufacturing process (part 2) of the piezoelectric actuator according to the variant of the first embodiment of the present invention.

Next, in the process illustrated in FIG. 19, the resist films 87 illustrated in FIG. 18 are removed.

Figure 20:
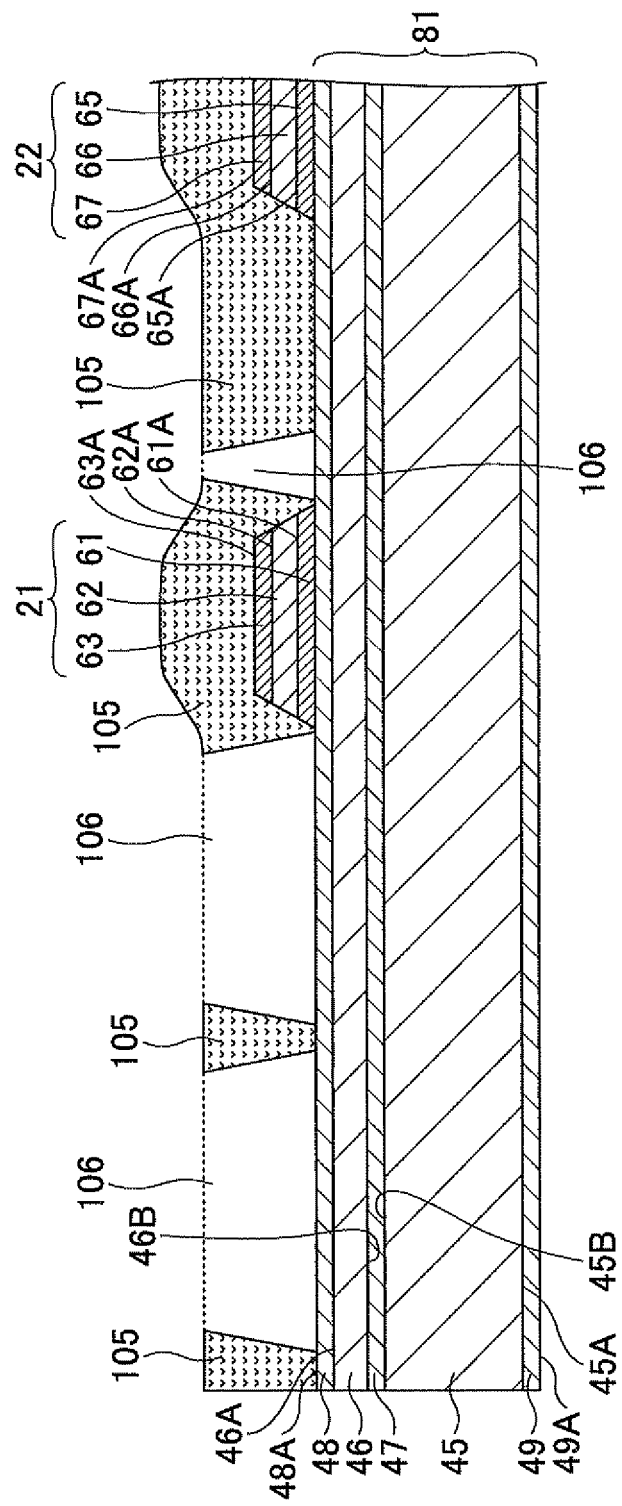
FIG. 20 is a drawing illustrating a manufacturing process (part 3) of the piezoelectric actuator according to the variant of the first embodiment of the present invention.

Next, in the process illustrated in FIG. 20, a resist film 105 for lift-off is formed on the structure illustrated in FIG. 19 (a lift-off resist film forming process). The resist film 105 has openings 106 which have cross-sections of a reverse tapered shape and expose parts of the upper surface of the substrate 81 associated with areas for forming the pads 13-15 and the wiring 17-19, 25-1, 25-2, 26 and 27.

Figure 21:
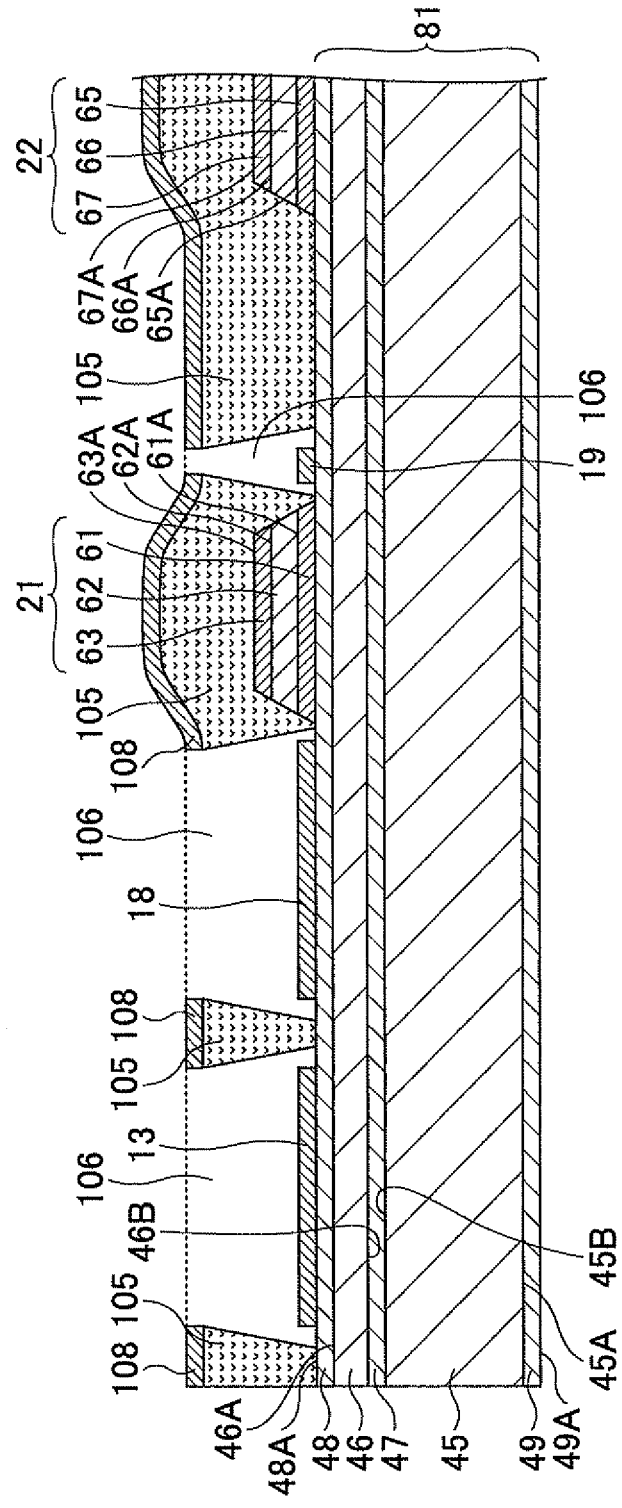
FIG. 21 is a drawing illustrating a manufacturing process (part 4) of the piezoelectric actuator according to the variant of the first embodiment of the present invention.

Next, in the process illustrated in FIG. 21, metal films 108 are formed from the upper surface side of the structure illustrated in FIG. 20, thereby the pads 13-15 and the wiring 17-19, 25-1, 25-2, 26 and 27 are formed of the metal films 108 passing through the openings 106 (a metal film forming process). It is noted that in FIGS. 21-23, the illustrations of pads 14 and 15 and the wirings 18, 19, 25-1, 25-2, 26 and 27 are omitted because they are difficult to be illustrated in these drawings.

At that time, unnecessary metal films 108 are formed on the resist film 105. The metal films 108 may have a lower resistance value than the metal films forming the first and second lower electrodes 61 and 65, for example. The metal films 108 may be formed of Ti/Ni/Au multilayered films or Al films (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

In this way, by patterning the metal films 108 whose resistance values are lower than that of the metal films forming the first and second lower electrodes 61 and 65 to form the pads 13-15 and the wiring 17-19, 25-1, 25-2, 26 and 27, it is possible to prevent the reduction of the bending efficiency of the piezoelectric actuator 10 due to the wirings 19, 26 and 27, and reduce resistance values of the pads 13-15 and the wiring 17-19, 25-1, 25-2, 26 and 27.

Figure 22:
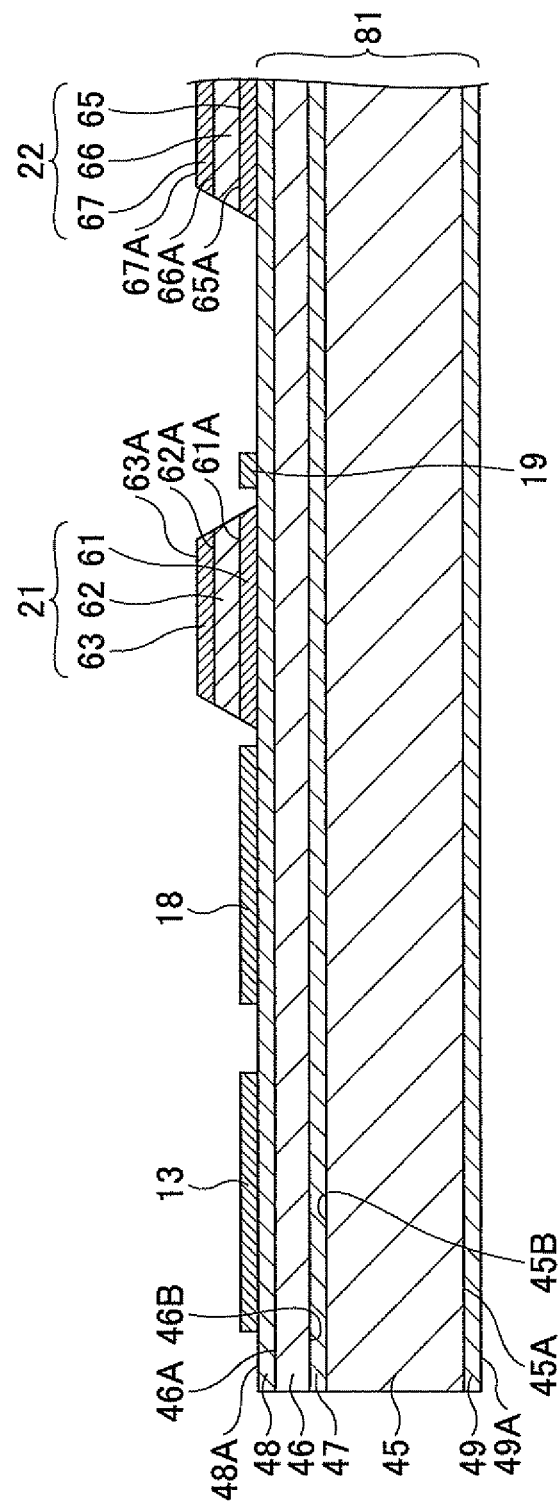
FIG. 22 is a drawing illustrating a manufacturing process (part 5) of the piezoelectric actuator according to the variant of the first embodiment of the present invention.

Next, in the process illustrated in FIG. 22, the resist films 105 for lift-off illustrated in FIG. 21 are removed (a lift-off process).

In this way, the unnecessary metal films 108 formed on the upper surface of the resist film 105 are removed together with the resist film 105.

Figure 23:
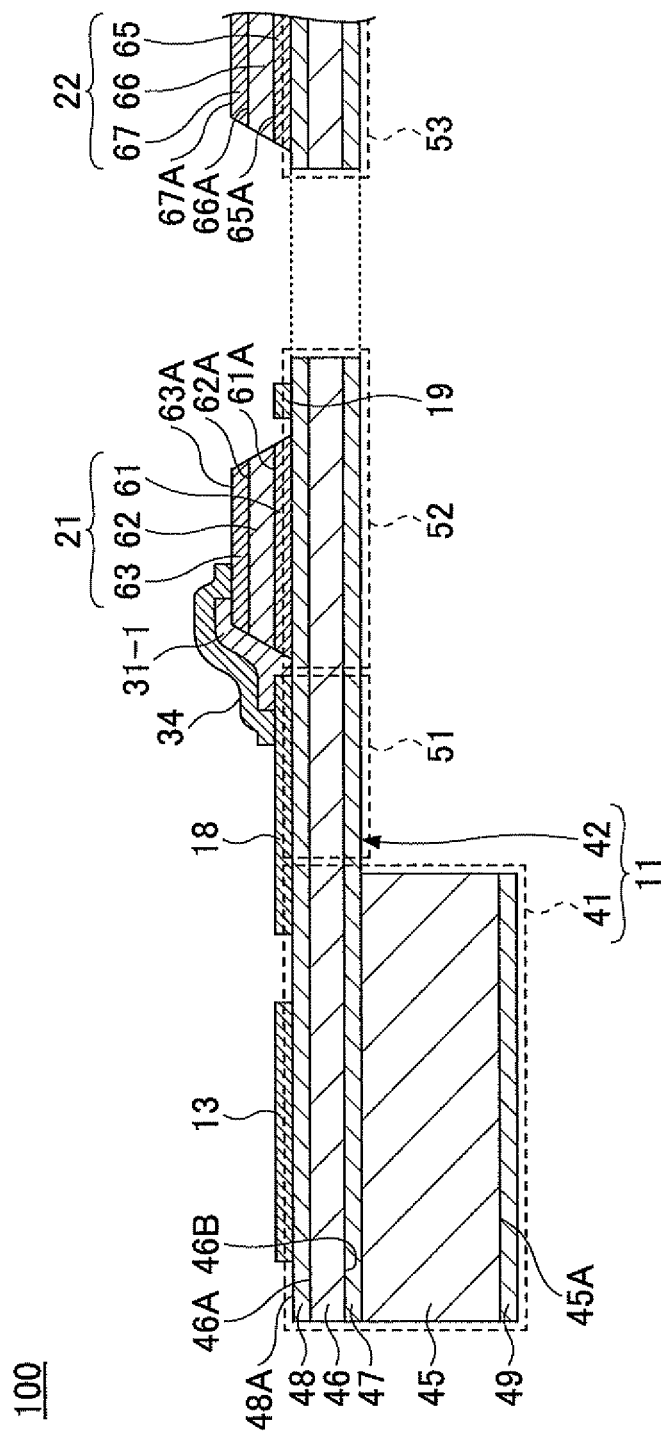
FIG. 23 is a drawing illustrating a manufacturing process (part 6) of the piezoelectric actuator according to the variant of the first embodiment of the present invention.

Next, in the process illustrated in FIG. 23, the same processes as illustrated in FIGS. 16 and 17 and described above are performed to form the support member 11 including the frame body 41 and the support body 42. In this way, the piezoelectric actuator 100 according to the variant of the first embodiment is manufactured.

According to the manufacturing process of the piezoelectric actuator of the variant of the embodiment, by patterning the metal films 108 whose resistance values are lower than those of the metal films forming the first and second lower electrodes 61 and 65 to form the pads 13-15 and the wiring 17-19, 25-1, 25-2, 26 and 27, it is possible to prevent the reduction of the bending efficiency of the piezoelectric actuator 10 due to the wirings 19, 26 and 27, and reduce resistance values of the pads 13-15 and the wiring 17-19, 25-1, 25-2, 26 and 27.

[Second Embodiment]

Figure 24:
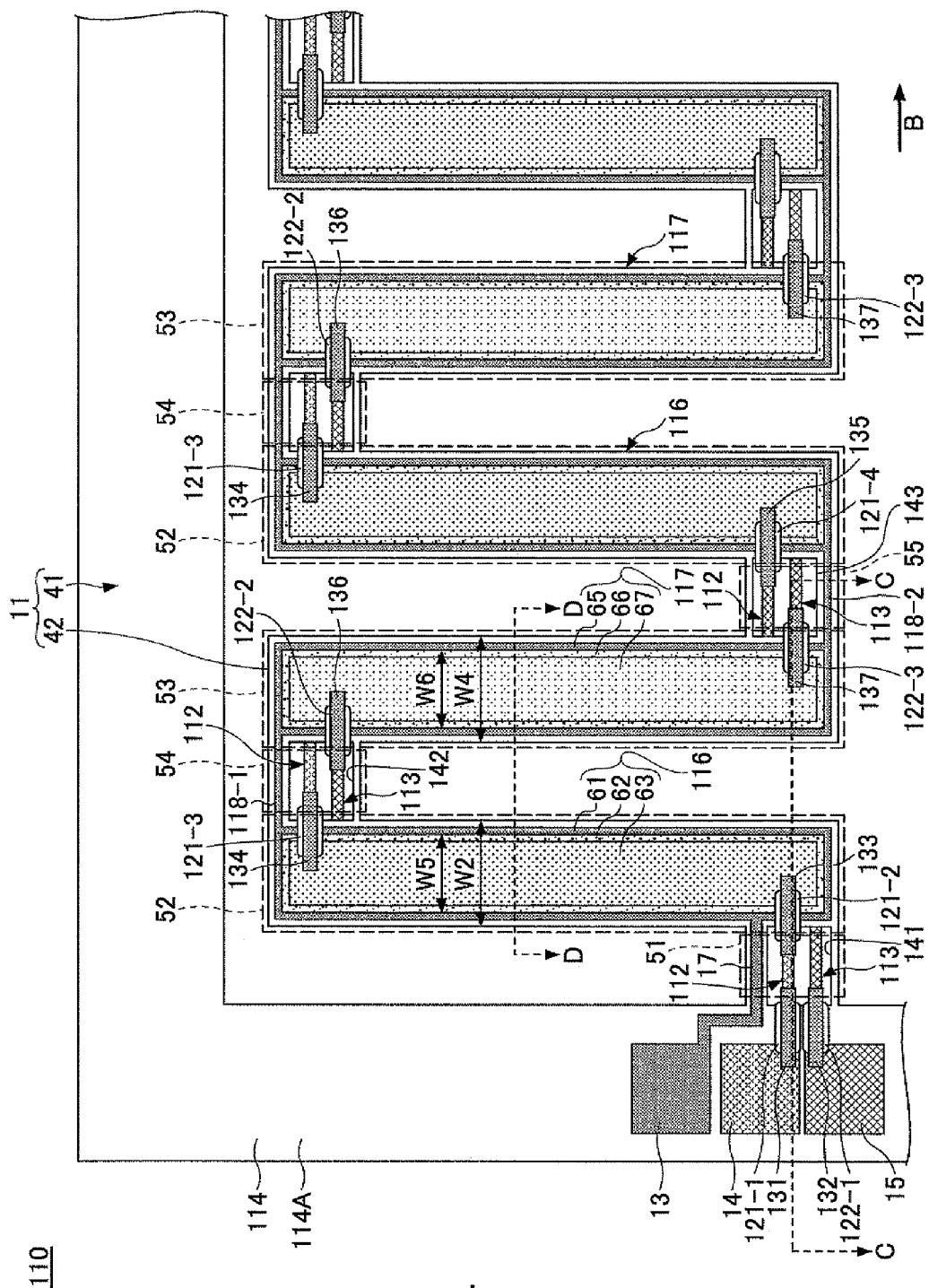
FIG. 24 is a plane view of the piezoelectric actuator according to the second embodiment of the present invention.
Figure 25:
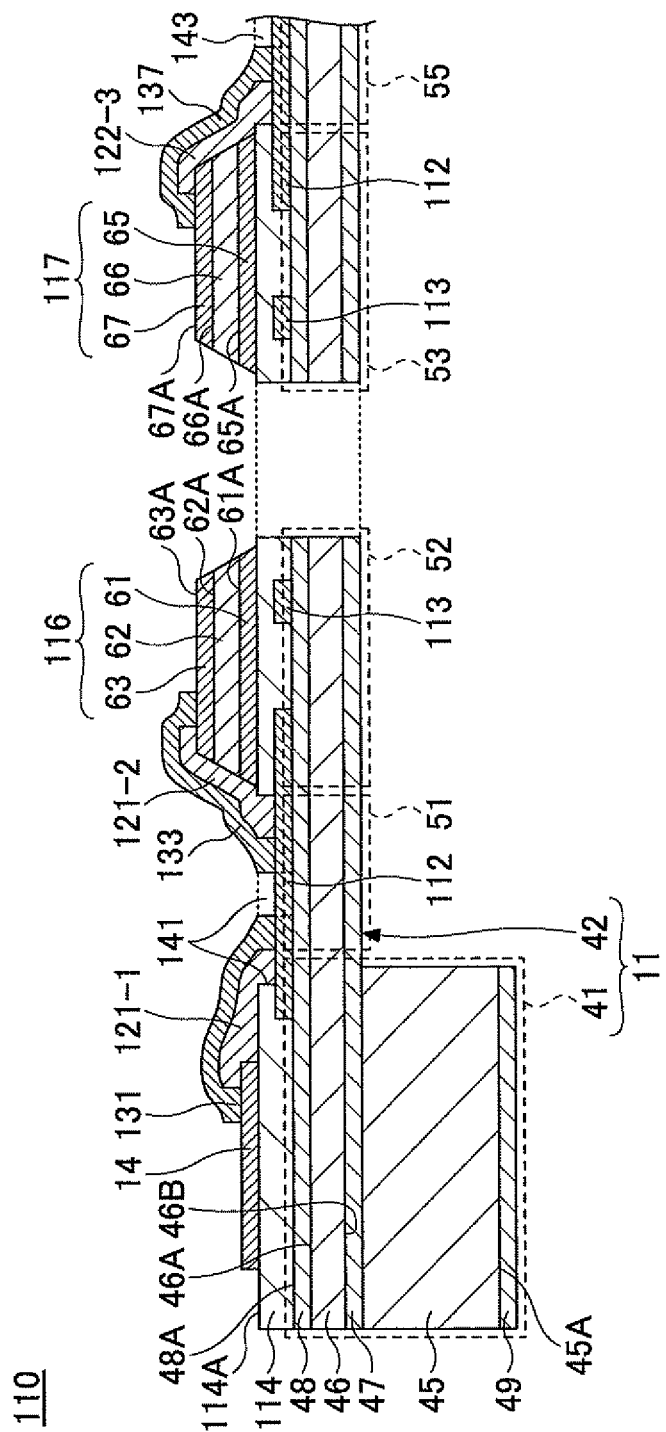
FIG. 25 is a cross-sectional view of the piezoelectric actuator along a line C-C in FIG. 24.
Figure 26:
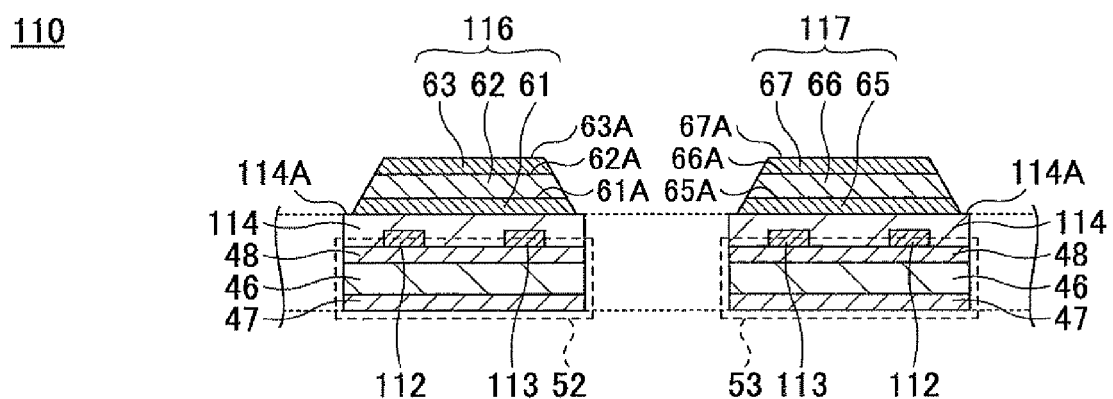
FIG. 26 is a cross-sectional view of the piezoelectric actuator along a line D-D in FIG. 24.

FIG. 24 is a plane view of the piezoelectric actuator according to a second embodiment of the present invention. FIG. 25 is a cross-sectional view of the piezoelectric actuator along a line C-C in FIG. 24. FIG. 26 is a cross-sectional view of the piezoelectric actuator along a line D-D in FIG. 24.

With reference to FIGS. 24 and 25, a piezoelectric actuator 110 according to the second embodiment is configured as is the case with the piezoelectric actuator 10 according to the first embodiment except that instead of the wirings 18, 19, 25-1, 25-2, 26, 27, 34, 35, 36-1, 36-2, 37-1 and 37-2, the first and second piezoelectric cantilevers 21 and 22, the first insulating elements 31-1, 31-2 and 31-3 and second insulating element 32-1, 32-2 and 32-3 included in the piezoelectric actuator 10 according to the first embodiment, a wiring 112 as second wirings, a wiring 113 as third wirings, first and second piezoelectric cantilevers 116 and 117, wirings 118-1 and 118-2 as first wirings, first insulating elements 121-1, 121-2, 121-3 and 121-4, second insulating elements 122-1, 122-2 and 122-3, wirings 131 and 132, wirings 133-135 as fourth wirings, and wirings 136 and 137 as fifth wirings are provided, an insulating layer 114 is provided, and the pads 13-15 and the wiring 17 are provided on an upper surface 114A of the insulating layer 114.

The wiring 112 is continuous such that it is provided on the upper surfaces of the coupling part 51 and the first, second third support parts 52-55. The wiring 112 has a shape such that it follows the outside shapes of the coupling part 51 and the first, second third support parts 52-55. The wiring 112 is coupled to the wirings 131 and 133-135 to electrically couple the pad 14 and the first upper electrodes 63.

The wiring 112 is formed of the metal film. The wiring 112 may be formed of a Ti/Ni/Au multilayered film or an Al film (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

In this way, since the wiring 112, which is provided on the upper surfaces of the coupling part 51 and the first, second third support parts 52-55, is formed of the metal film, components of the wiring 112 no longer include the piezoelectric material the piezoelectric material (i.e., the dielectric layer 84 as a base material for the first and second piezoelectric bodies 62 and 66), which prevents the reduction of the bending efficiency of the piezoelectric actuator 110 due to the wiring 112.

Further, by using the Ti/Ni/Au multilayered film or Al film to form the wiring 112, it is possible to reduce resistance value of the wiring 112. The width of the wirings 112 may be 15 micrometers, for example.

The wiring 113 is continuous such that it is provided on the upper surfaces of the coupling part 51 and the first, second third support parts 52-55. The wiring 113 has a shape such that it follows the outside shapes of the coupling part 51 and the first, second third support parts 52-55. The wiring 113 is coupled to the wirings 132, 136 and 137 to electrically couple the pad 15 and the second upper electrodes 67.

The wiring 113 is formed of the metal film. The wiring 113 may be formed of a Ti/Ni/Au multilayered film or an Al film (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

In this way, since the wiring 113, which is provided on the upper surfaces of the coupling part 51 and the first, second third support parts 52-55, is formed of the metal film, components of the wiring 113 no longer include the piezoelectric material the piezoelectric material (i.e., the dielectric layer 84 as a base material for the first and second piezoelectric bodies 62 and 66), which prevents the reduction of the bending efficiency of the piezoelectric actuator 110 due to the wiring 113.

Further, by using the Ti/Ni/Au multilayered film or Al film to form the wiring 113, it is possible to reduce resistance value of the wiring 113. The width of the wirings 113 may be 15 micrometers, for example.

The insulating layer 114 is provided on the upper surface of the support member 11 such that it covers parts of the wirings 112 and 113 which are formed on the upper surfaces of the first and second support parts 52 and 53. The insulating layer 114 has a flat upper surface 114A. Parts of the upper surface 114A provided on the first support parts 52 are for forming the first piezoelectric cantilevers 116. Further, parts of the upper surface 114A provided on the second support parts 53 are for forming the second piezoelectric cantilevers 117.

The insulating layer 114 has openings 141-143. The opening 141 is formed such that a part of the upper surface of the wirings 112 and 113 provided on the coupling part 51 is exposed through the opening 141. The openings 142 are formed such that parts of the upper surfaces of the wirings 112 and 113 provided on the third coupling part 54 are exposed through the openings 142. The openings 143 are formed such that parts of the upper surfaces of the wirings 112 and 113 provided on the third coupling part 55 are exposed through the openings 143. A $SiO_2$ film, for example, may be used as the insulating layer 114. In this case, the thickness of the insulating layer 114 may be 1 micrometer, for example.

The first piezoelectric cantilevers 116 are provided on parts of the upper surface 114A of the insulating layer 114 as a whole which are provided on the first support parts 52. In other words, the first piezoelectric cantilevers 116 are provided on a plane (i.e., the upper surface 114A of the insulating layer 114) which is separate from a plane (i.e., the upper surface 48A of the SiO2 film 48) on which the wirings 112 and 113 are formed. The first piezoelectric cantilevers 116 are configured as is the case with the first piezoelectric cantilevers 21 according to the first embodiment described above except that it is wider than the first piezoelectric cantilevers 21 (i.e., it has the increased area with respect to the first piezoelectric cantilevers 21). Specifically, each first piezoelectric cantilever 116 has a multilayered structure in which the first lower electrode 51, the first piezoelectric body 62 and the first upper electrode 63 are formed successively.

In this way, the wirings 112 and 113 are provided on the upper surfaces of the first and second support parts 52 and 53, the insulating layer 114 with the flat upper surface 114A for covering the parts of the wirings 112 and 113 formed on the upper surfaces of the first and second support parts 52 and 53 is provided, and the first piezoelectric cantilevers 116 are provided on the parts of the upper surface 114A of the insulating layer 114 formed on the first support parts 52. Thus, since the first piezoelectric cantilevers 116 can be provided over the overall upper surface 114A of the insulating layer 114, the areas of the first piezoelectric cantilevers 116 can be increased. Therefore, the bending amount of the first piezoelectric cantilevers 116 can be increased.

If the width W2 of the first support parts is 200 micrometers, the width W5 of the first piezoelectric bodies 62 may be 180 micrometers, for example.

The second piezoelectric cantilevers 117 are provided on parts of the upper surface 114A of the insulating layer 114 as a whole which are provided on the second support parts 53. In other words, the second piezoelectric cantilevers 117 are provided on a plane (i.e., the upper surface 114A of the insulating layer 114) which is separate from a plane (i.e., the upper surface 48A of the SiO2 film 48) on which the wirings 112 and 113 are formed. The second piezoelectric cantilevers 117 are configured as is the case with the second piezoelectric cantilevers 22 according to the first embodiment described above except that it is wider than the second piezoelectric cantilevers 22 (i.e., it has the increased area with respect to the second piezoelectric cantilevers 22). Specifically, each second piezoelectric cantilever 117 has a multilayered structure in which the second lower electrode 65, the second piezoelectric body 66 and the second upper electrode 67 are formed successively.

In this way, the wirings 112 and 113 are provided on the upper surfaces of the first and second support parts 52 and 53, the insulating layer 114 with the flat upper surface 114A for covering the parts of the wirings 112 and 113 formed on the upper surfaces of the first and second support parts 52 and 53 is provided, and the second piezoelectric cantilevers 117 are provided on the parts of the upper surface 114A of the insulating layer 114 formed on the second support parts 53. Thus, since the second piezoelectric cantilevers 117 can be provided over the overall upper surface 114A of the insulating layer 114, the areas of the second piezoelectric cantilevers 117 can be increased. Therefore, the bending amount of the second piezoelectric cantilevers 117 can be increased.

If the width W4 of the second support parts 53 is 200 micrometers, the width W6 of the second piezoelectric bodies 66 may be 180 micrometers, for example.

The wirings 118-1 are provided on the upper surface 114A of the insulating layer 114 formed on the third support parts 54. Each wiring 118-1 has one end portion coupled to the corresponding first lower electrode 61 and another end portion coupled to the corresponding second lower electrode 65.

The wirings 118-2 are provided on the upper surface 114A of the insulating layer 114 formed on the third support parts 55. Each wiring 118-2 has one end portion coupled to the corresponding second lower electrode 65 and another end portion coupled to the corresponding first lower electrode 61.

The wirings 118-1 and 118-2 are formed integrally with the first and second lower electrodes 61 and 65 to electrically couple the first and second lower electrodes 61 and 65.

The wirings 118-1 and 118-2 may be formed of Ti/Pt multilayered films which are formed by successively forming Ti films (10 nm of thickness, for example) and Pt films (100 nm of thickness, for example), for example.

The first insulating element 121-1 is provided such that it extends from the end portion of the pad 14 to a part of the upper surface of the wiring 112 exposed out of the opening 141. The upper surface of the first insulating element 121-1 is gently inclined. The first insulating element 121-1 is provided for forming the wiring 131.

The first insulating element 121-2 is provided such that it covers a part of the side of the first piezoelectric cantilever 116 located near the opening 141, and extends from a part of the upper surface of the wiring 112 exposed via the opening 141 to the first upper electrode 63. The upper surface of the first insulating element 121-2 is gently inclined. The first insulating element 121-2 prevents the wiring 133 formed on the upper surface of the first insulating element 121-2 from being electrically coupled to the first lower electrode 61.

The first insulating elements 121-3 are provided such that they cover parts of the first piezoelectric cantilevers 116 located near the openings 142, and extend from parts of the upper surface of the wiring 112 exposed via the openings 142 to the first upper electrodes 63. The upper surfaces of the first insulating elements 121-3 are gently inclined. The first insulating elements 121-3 prevent the wirings 134 formed on the upper surface of the first insulating elements 121-3 from being electrically coupled to the first lower electrodes 61.

The first insulating elements 121-4 are provided such that they cover parts of the first piezoelectric cantilevers 116 located near the openings 143, and extend from parts of the upper surface of the wiring 112 exposed via the openings 143 to the first upper electrodes 63. The upper surfaces of the first insulating elements 121-4 are gently inclined. The first insulating elements 121-4 prevent the wirings 135 formed on the upper surface of the first insulating elements 121-4 from being electrically coupled to the first lower electrodes 61.

The first insulating elements 121-1, 121-2, 121-3 and 121-4 may be formed from a photosensitive resin, for example.

The second insulating element 122-1 is provided such that it extends from the end portion of the pad 15 to a part of the upper surface of the wiring 113 exposed out of the opening 141. The upper surface of the second insulating element 122-1 is gently inclined. The second insulating element 122-1 is provided for forming the wiring 132.

The second insulating elements 122-2 are provided such that it covers parts of the sides of the second piezoelectric cantilevers 117 located near the opening 142, and extend from parts of the upper surface of the wiring 113 exposed via the openings 142 to the second upper electrodes 67. The upper surfaces of the second insulating elements 122-2 are gently inclined. The second insulating elements 122-2 prevent the wirings 136 formed on the upper surfaces of the second insulating elements 122-2 from electrically coupling to the second lower electrodes 65.

The second insulating elements 122-3 are provided such that they cover parts of the second piezoelectric cantilevers 117 located near the openings 143, and extend from parts of the upper surface of the wiring 113 exposed via the openings 143 to the second upper electrodes 67. The upper surfaces of the second insulating elements 122-3 are gently inclined. The second insulating elements 122-3 prevent the wiring 137 formed on the upper surfaces of the second insulating elements 122-3 from electrically coupling to the second lower electrodes 65.

The wiring 131 is provided on the upper surface of the first insulating element 121-1. The wiring 131 has one end portion coupled to the upper surface of the pad 14 and another end portion coupled to a part of the upper surface of the wiring 112 exposed via the opening 141. In this way, the wiring 131 electrically couples the pad 14 and the wiring 112.

The wiring 132 is provided on the upper surface of the second insulating element 122-1. The wiring 132 has one end portion coupled to the upper surface of the pad 15 and another end portion coupled to a part of the upper surface of the wiring 113 exposed via the opening 141. In this way, the wiring 132 electrically couples the pad 15 and the wiring 113.

The wiring 133 is provided on the upper surface of the first insulating element 121-2. The wiring 133 has one end portion coupled to a part of the upper surface of the wiring 112 exposed via the opening 141 and another end portion coupled to the upper surface of the first upper electrode 63. In this way, the wiring 133 electrically couples the pad 14 and the first upper electrodes 63 via the wirings 112 and 131.

The wirings 134 are provided on the upper surfaces of the first insulating elements 121-3. Each wiring 134 has one end portion coupled to the corresponding first upper electrode 63 located near the opening 142 and another end portion coupled to a part of the upper surface of the wiring 112 exposed via the corresponding opening 142.

The wirings 135 are provided on the upper surfaces of the first insulating elements 121-4. Each wiring 135 has one end portion coupled to the corresponding first upper electrode 63 located near the opening 143 and another end portion coupled to a part of the upper surface of the wiring 112 exposed via the corresponding opening 143. In this way, the first upper electrodes 63 are electrically coupled via the wirings 112, 134 and 135.

The wirings 136 are provided on the upper surfaces of the first insulating elements 122-2. Each wiring 136 has one end portion coupled to a part of the upper surface of the wiring 113 exposed via the corresponding opening 142 and another end portion coupled to the upper surface of the corresponding second upper electrode 67. In this way, the wiring 136 electrically couples the pad 15 and the second upper electrodes 67 via the wirings 113 and 132.

The wirings 137 are provided on the upper surfaces of the first insulating elements 122-3. Each wiring 137 has one end portion coupled to a part of the upper surface of the wiring 113 exposed via the corresponding opening 143 and another end portion coupled to the upper surface of the corresponding second upper electrode 67. In this way, the second upper electrodes 67 are electrically coupled via the wirings 113, 136 and 137.

The wirings 131-137 may be formed of Ti/Ni/Au multilayered films or Al films (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

By using the Ti/Ni/Au multilayered films or Al films to form the wirings 131-137, it is possible to reduce resistance values of the wirings 131-137.

According to the piezoelectric actuator of the present embodiment, since the wirings 112 and 113, which are provided on the upper surfaces of the coupling part 51 and the first, second third support parts 52-55, is formed of the metal film, components of the wirings 112 and 113 no longer include the piezoelectric material the piezoelectric material (i.e., the dielectric layer 84 as a base material for the first and second piezoelectric bodies 62 and 66), which prevents the reduction of the bending efficiency of the piezoelectric actuator 110 due to the wirings 112 and 113.

Further, since the wirings 112 and 113 are provided on the upper surfaces of the coupling part 51 and the first, second third support parts 52-55, and the first and second piezoelectric cantilevers 116 and 117 are provided on the upper surface 114A of the insulating layer 114 which covers the wirings 112 and 113 provided on the first and second support parts 52 and 53, the first and second piezoelectric cantilevers 116 and 117 can be provided over the overall upper surface 114A of the insulating layer 114 provided on the first and second support parts 52 and 53, thereby increasing the bending amounts of the first and second piezoelectric cantilevers 116 and 117.

FIGS. 27-41 are drawings illustrating a manufacturing process of the piezoelectric actuator according to the second embodiment of the present invention. In FIGS. 27-41, the same elements as those of the piezoelectric actuator 110 of the second embodiment are referred to by the same numerals.

With reference to FIGS. 27-41, the manufacturing process of the piezoelectric actuator 110 according to the second embodiment is described. At first, the substrate 81 illustrated in FIG. 5 according to the first embodiment is prepared.

Figure 27:
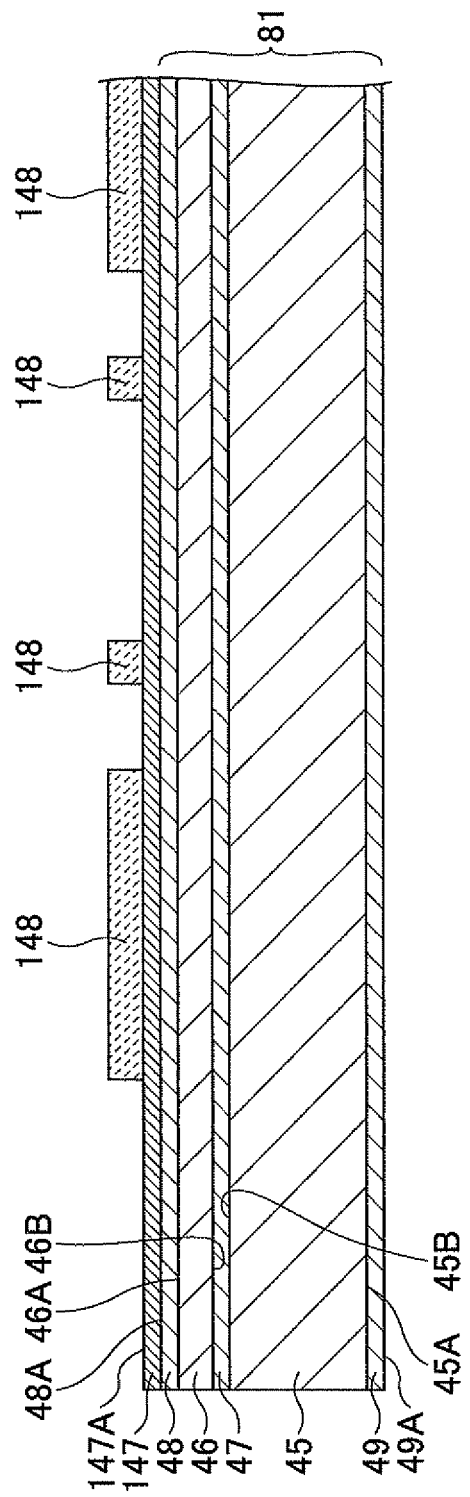
FIG. 27 is a drawing illustrating a manufacturing process (part 1) of the piezoelectric actuator according to a second embodiment of the present invention.

Next, in the process illustrated in FIG. 27, a metal film 147 is formed on the upper surface of the substrate and then resist films 148 for etching are formed such that they cover parts of the upper surface 147A of the metal film 147 associated with areas for forming the wirings 112 and 113.

The metal film 147 is a base material for the wirings 112 and 113. The metal film 147 may be formed by a sputtering process, for example. The metal film 147 may be formed of a Ti/Ni/Au multilayered film or an Al film (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

Further, by using the Ti/Ni/Au multilayered film or Al film to form the wiring 147, it is possible to reduce resistance value of the wiring 113.

Figure 28:
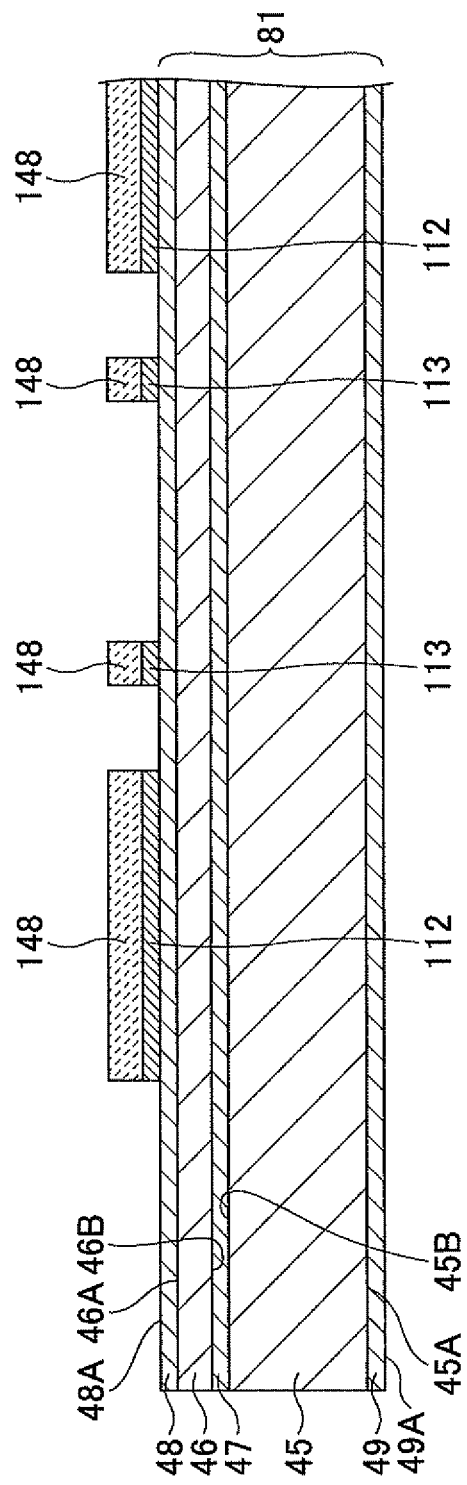
FIG. 28 is a drawing illustrating a manufacturing process (part 2) of the piezoelectric actuator according to the second embodiment of the present invention.

Next, in the process illustrated in FIG. 28, the wirings 112 and 113 covered with the resist films 148 are formed by etching, by means of an anisotropic etching process (a dry etching process, for example), parts of the metal film 147 exposed out of the resist films 148 until the upper surface 48A of the SiO₂ film 48 is exposed. It is noted that the process illustrated in FIGS. 27 and 28 corresponds to "a second/third wirings forming process".

In this way, since the wirings 112 and 113 are formed by patterning the metal layer 147, components of the second and third wirings 11.2 and 113 no longer include the piezoelectric material, which prevents the reduction of the bending efficiency of the piezoelectric actuator 110 due to the wirings 112 and 113.

The width of the wirings 112 may be 50 micrometers, for example. The width of the wirings 113 may be 50 micrometers, for example.

Figure 29:
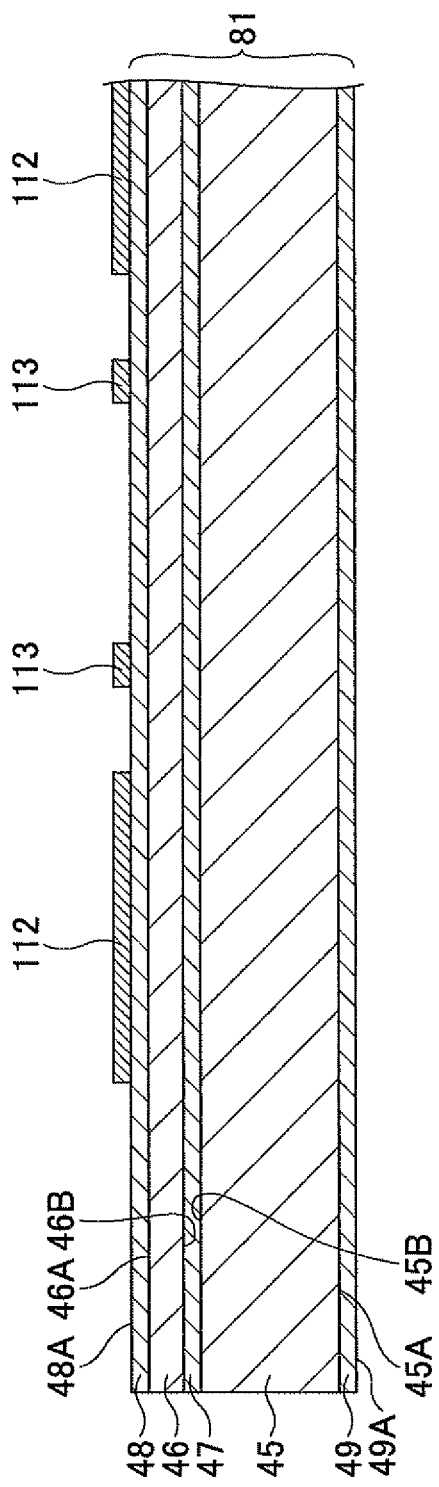
FIG. 29 is a drawing illustrating a manufacturing process (part 3) of the piezoelectric actuator according to the second embodiment of the present invention.

Next, in the process illustrated in FIG. 29, the resist films 148 illustrated in FIG. 28 are removed.

Figure 30:
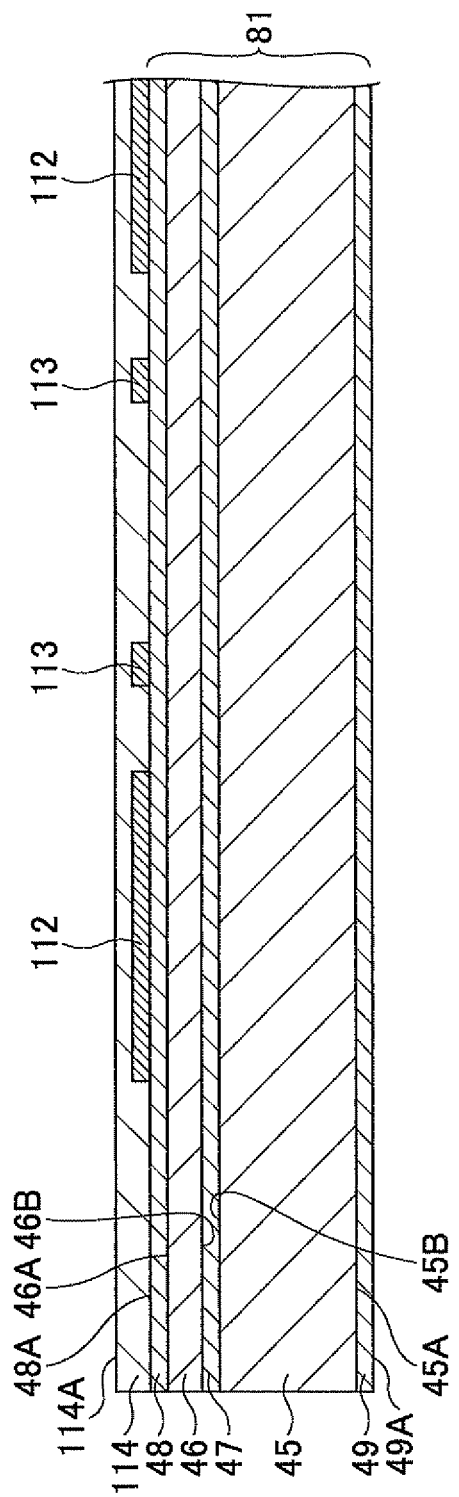
FIG. 30 is a drawing illustrating a manufacturing process (part 4) of the piezoelectric actuator according to the second embodiment of the present invention.

Next, in the process illustrated in FIG. 30, the insulating layer 114 having the flat upper surface 114A is formed such that it covers the upper surfaces of the wirings 112 and 113 and the upper surface of the substrate 81.

Specifically, a SiO₂ film as a base material for the insulating layer 114 is formed by a CVD (Chemical Vapor Deposition) process, and then the upper surface 114A of the insulating layer 114 is flattened by a CMP (Chemical Mechanical Polishing) process, for example. The thickness of the flattened insulating layer 114 may be 1 micrometer, for example.

By flattening the upper surface 114A of the insulating layer 114, it is possible to precisely form the first and second piezoelectric cantilevers 116 and 117 on the upper surface 114A of the insulating layer 114.

Figure 31:
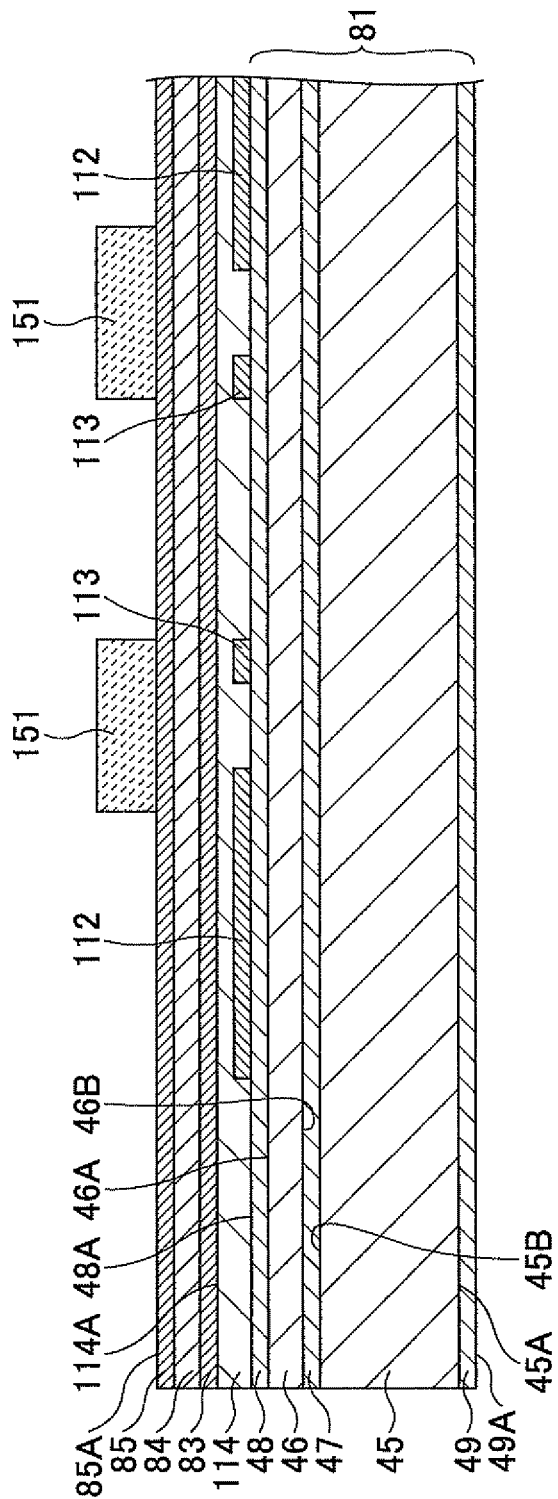
FIG. 31 is a drawing illustrating a manufacturing process (part 5) of the piezoelectric actuator according to the second embodiment of the present invention.

Next, in the process illustrated in FIG. 31, the same process as illustrated in FIG. 6 and described above in connection with the first embodiment is performed to form a first metal layer 83 as a base material for the first and second lower electrodes 61 and 65, a dielectric layer 84 as a base material for the first and second piezoelectric bodies 62 and 66, and a second metal layer 85 as a base material for the first and second upper electrodes 63 and 67 successively on the upper surface 114A of the insulating layer 114 (a piezoelectric cantilever base material forming process).

The first and second metal layers 83 and 85 may be formed of Ti/Pt multilayered films which are formed by successively forming Ti films (10 nm of thickness, for example) and Pt films (100 nm of thickness, for example), for example. The dielectric layer 84 may be a PZT film (thickness of 2 micrometers, for example), for example.

Then, resist films 151 for etching are formed such that they cover parts of the upper surface 85A of the second metal layer 85 which correspond to areas for forming the first and second piezoelectric cantilevers 116 and 117.

Figure 32:
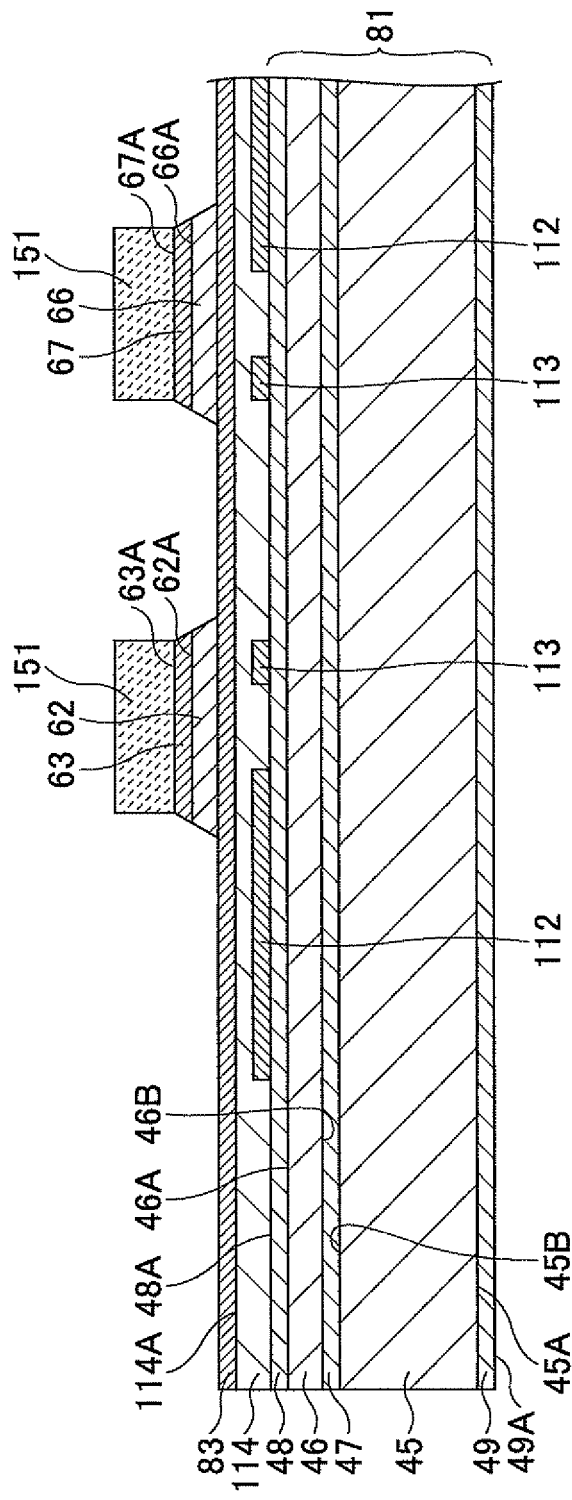
FIG. 32 is a drawing illustrating a manufacturing process (part 6) of the piezoelectric actuator according to the second embodiment of the present invention.

Next, in the process illustrated in FIG. 32, the same process as illustrated in FIG. 8 and described above in connection with the first embodiment is performed to simultaneously form the first and second upper electrodes 63 and 67 and the first and second piezoelectric bodies 62 and 66 are formed by etching parts of the dielectric layer 84 and the second metal layer 85 exposed out of the resist films 151 (an upper electrode/piezoelectric body forming process).

At that time, the etching process is performed such that sides of a structure of the first upper electrode 63 and the first piezoelectric body 62 and sides of a structure of the second upper electrode 67 and the second piezoelectric body 66 have inclined surfaces such that the widths of structures increase when viewed from the resist films 87 to the first metal layer 83 (The angle of inclination is 30 degrees, for example).

Figure 33:
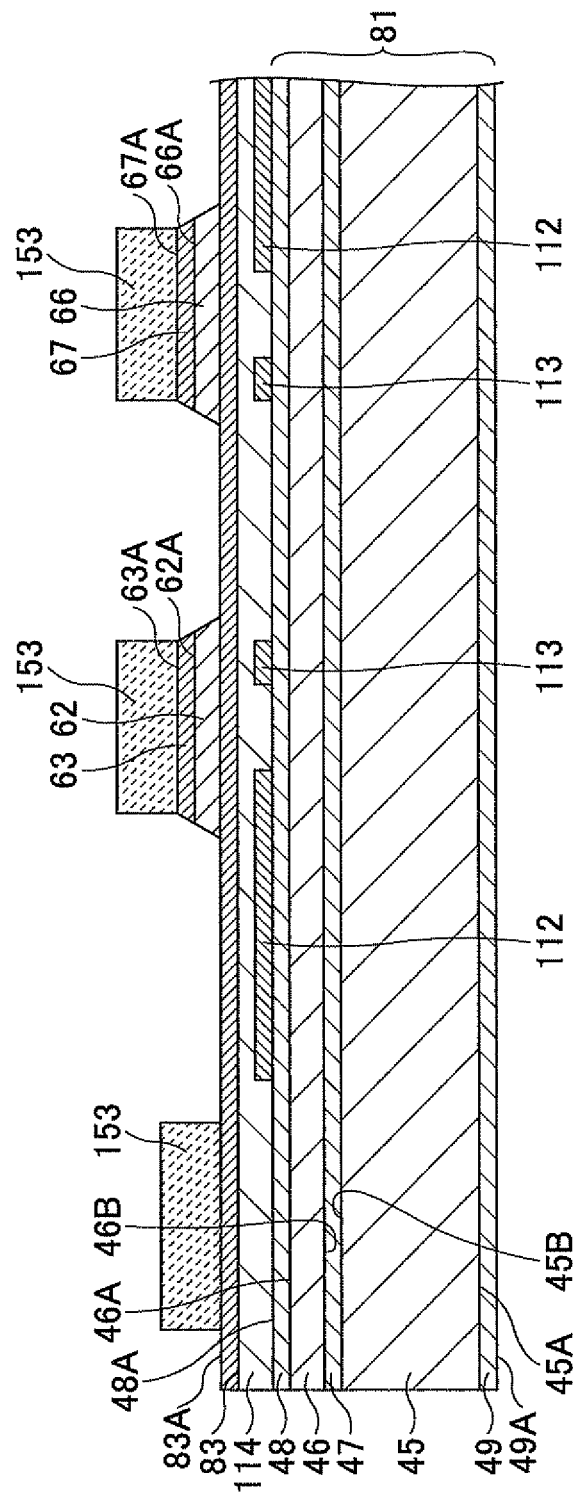
FIG. 33 is a drawing illustrating a manufacturing process (part 7) of the piezoelectric actuator according to the second embodiment of the present invention.

Next, in the process illustrated in FIG. 33, the resist films 151 illustrated in FIG. 32 are removed, and then resist films 153 for etching are formed such that they cover the upper surfaces 63A and 67A of the first and second upper electrodes 63 and 67 and respective parts of the upper surface 85A of the second metal layer 85 which are associated with areas for forming the pads 13-15, wirings 17, 118-1 and 118-2.

Figure 34:
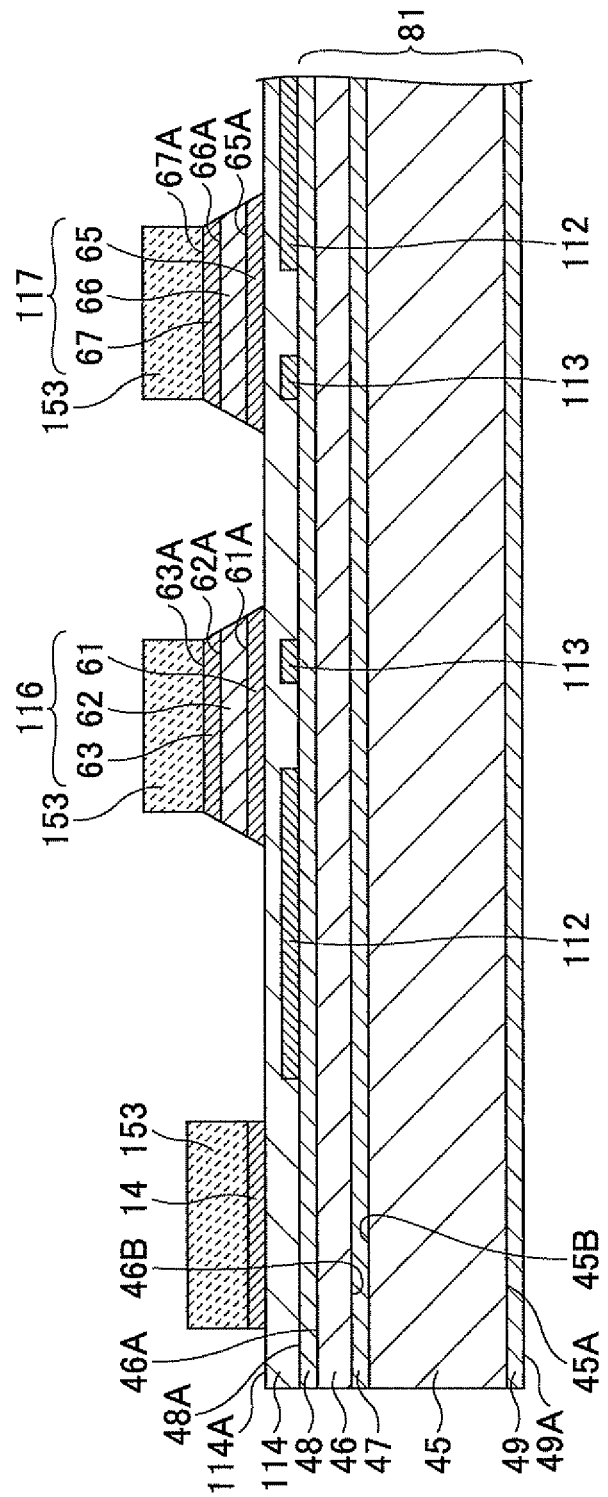
FIG. 34 is a drawing illustrating a manufacturing process (part 8) of the piezoelectric actuator according to the second embodiment of the present invention.

Next, in the process illustrated in FIG. 34, the first and second lower electrodes 61 and 65, and the pads 13-15, wirings 17, 118-1 and 118-2 are formed simultaneously by removing, by means of an anisotropic etching process (a dry etching process, for example) using the resist films 153 as masks, parts of the first metal layer 83 exposed out of the resist films 153 (a lower electrode/wiring forming process).

It is noted that in FIGS. 34-41, the illustrations of pads 13 and 15 and the wirings 17, 118-1 and 118-2 are omitted because they are difficult to be illustrated in these drawings.

In this way, the first piezoelectric cantilevers 116 are formed on the upper surface 114A of the insulating layer 114 provided on the first support parts 52, and the second piezoelectric cantilevers 117 are formed on the upper surface 114A of the insulating layer 114 provided on the second support parts 53. At that time, the sides of the first and second lower electrodes 61 and 65 also have tapered shapes.

Further, since the wirings 112 and 113 are formed on the upper surfaces of the coupling part 51 and the first, second third support parts 52-55, and the first and second piezoelectric cantilevers 116 and 117 are formed on the upper surface 114A of the insulating layer 114 which covers the wirings 112 and 113 provided on the first and second support parts 52 and 53, the first and second piezoelectric cantilevers 116 and 117 can be formed over the overall upper surface 114A of the insulating layer 114 provided on the first and second support parts 52 and 53, thereby increasing the bending amounts of the first and second piezoelectric cantilevers 116 and 117.

Figure 35:
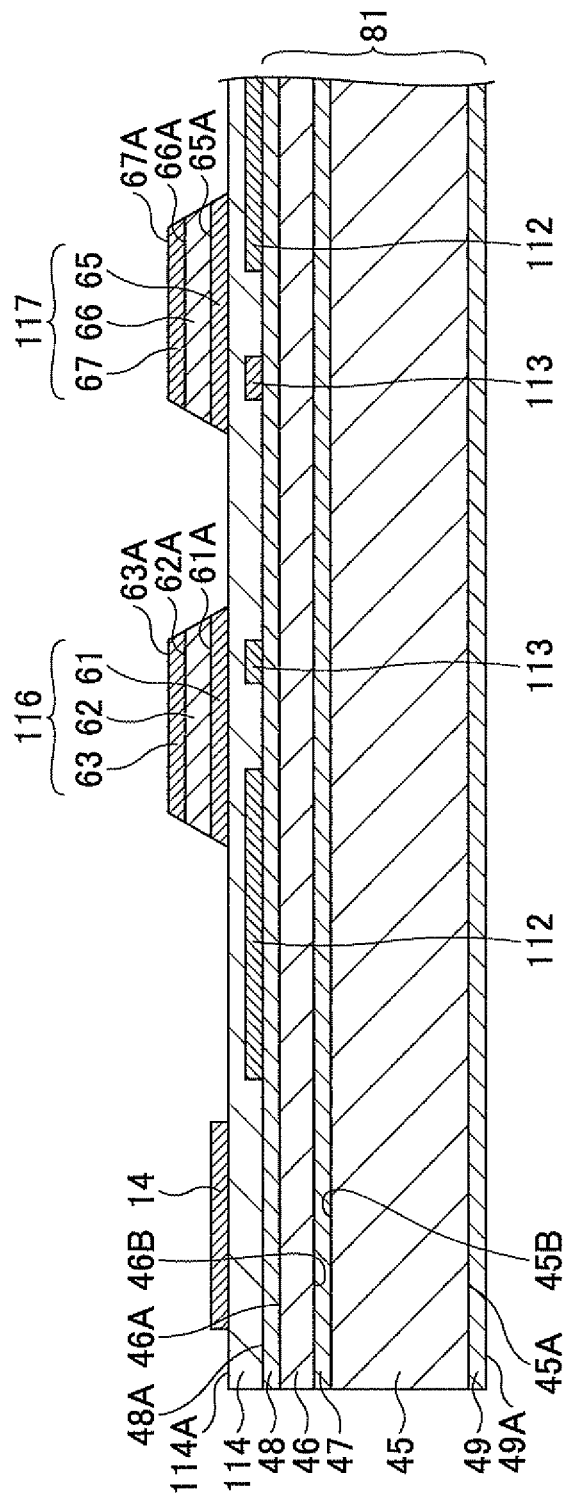
FIG. 35 is a drawing illustrating a manufacturing process (part 9) of the piezoelectric actuator according to the second embodiment of the present invention.

Next, in the process illustrated in FIG. 35, the resist films 153 illustrated in FIG. 34 are removed.

Figure 36:
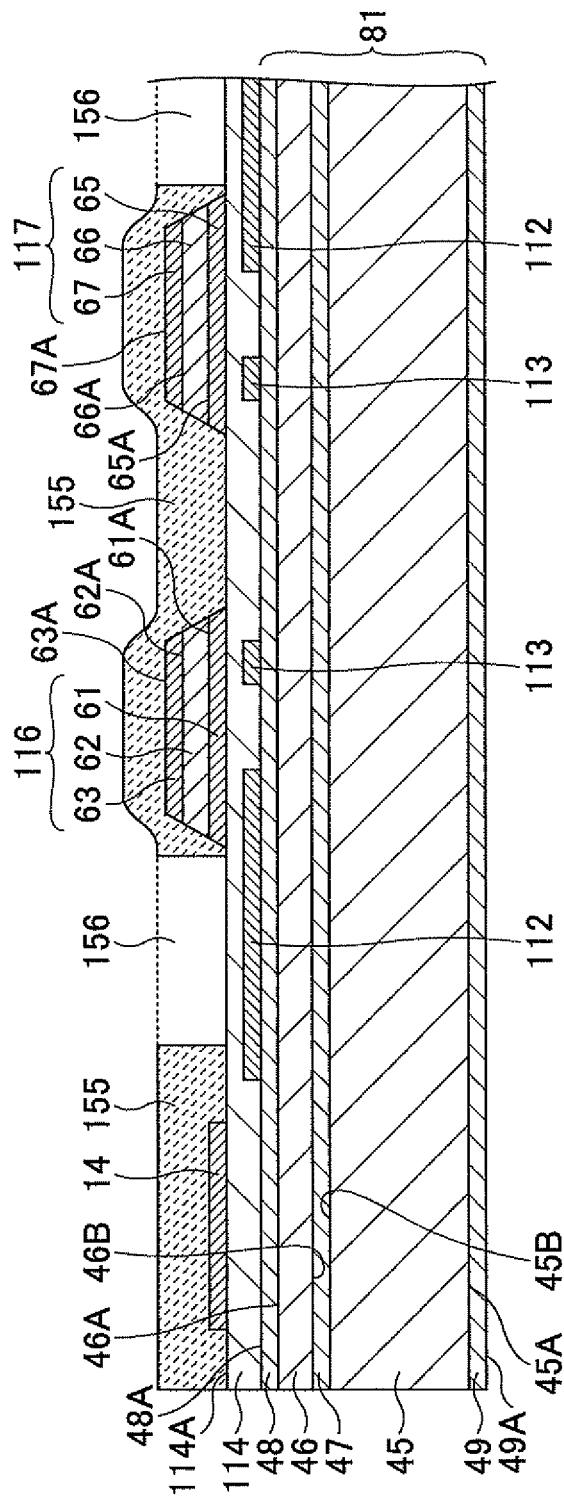
FIG. 36 is a drawing illustrating a manufacturing process (part 10) of the piezoelectric actuator according to the second embodiment of the present invention.

Next, in the process illustrated in FIG. 36, a resist film 155, which has openings 156 for exposing parts of the upper surface 114A of the insulating layer 114 associated with areas for forming openings 141-143 (see FIG. 24), is formed on the structure illustrated in FIG. 35.

Figure 37:
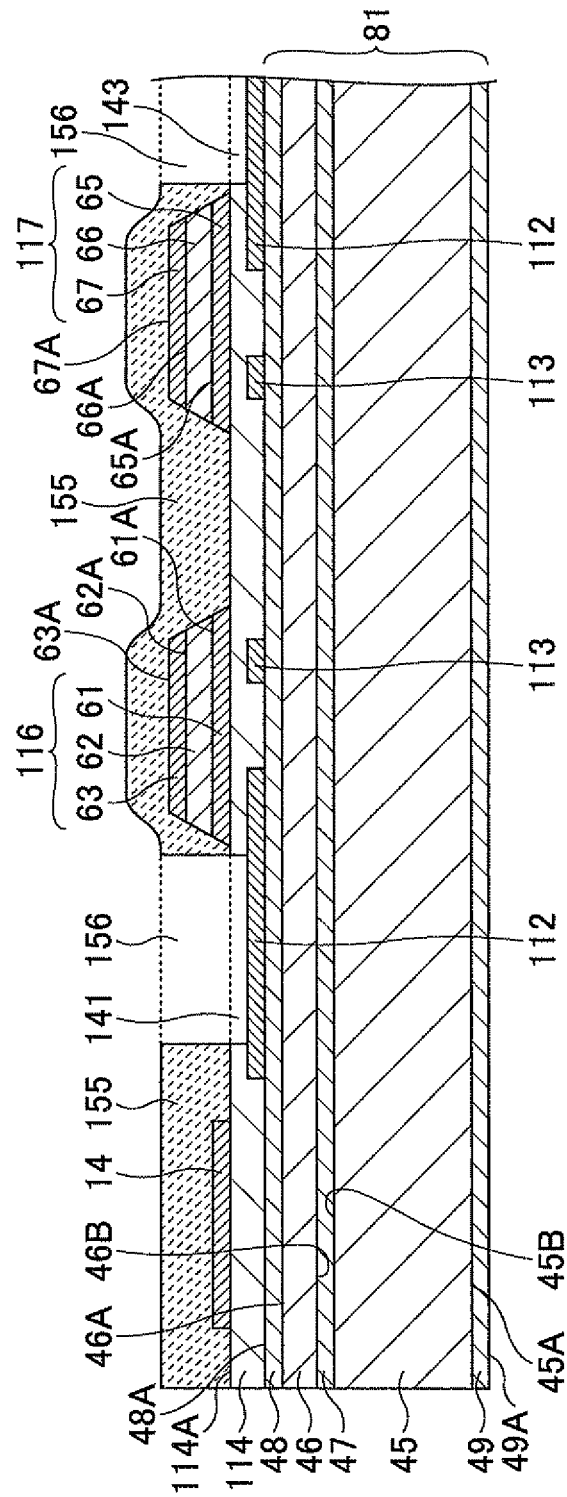
FIG. 37 is a drawing illustrating a manufacturing process (part 11) of the piezoelectric actuator according to the second embodiment of the present invention.

Next, in the process illustrated in FIG. 37, the openings 141-143 are formed by etching, by means of an anisotropic etching process (a dry etching process, for example), parts of the insulating layer 114 exposed out of the resist film 155 until the upper surfaces of the wirings 112 and 113 are exposed. The process illustrated in FIGS. 36 and 37 corresponds to "an opening forming process".

It is noted that in FIGS. 36-41, the illustration of the opening 142 is omitted because it is difficult to be illustrated in these drawings.

Figure 38:
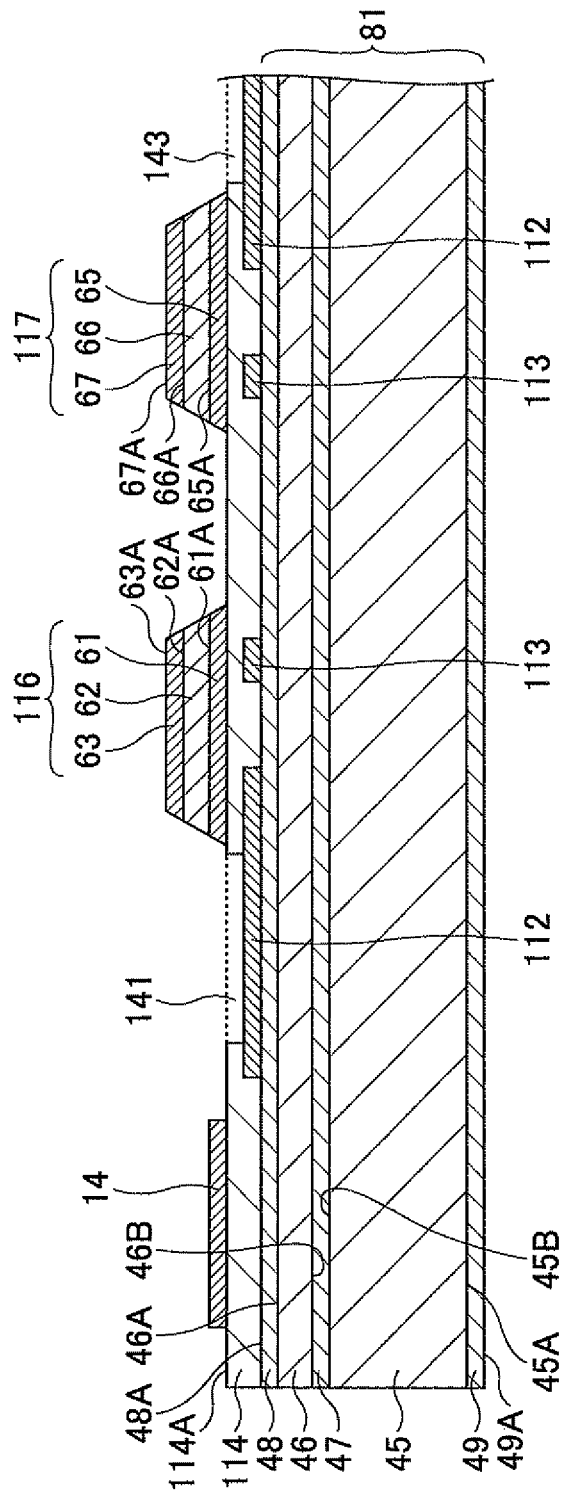
FIG. 38 is a drawing illustrating a manufacturing process (part 12) of the piezoelectric actuator according to the second embodiment of the present invention.

Next, in the process illustrated in FIG. 38, the resist film 155 illustrated in FIG. 37 is removed.

Figure 39:
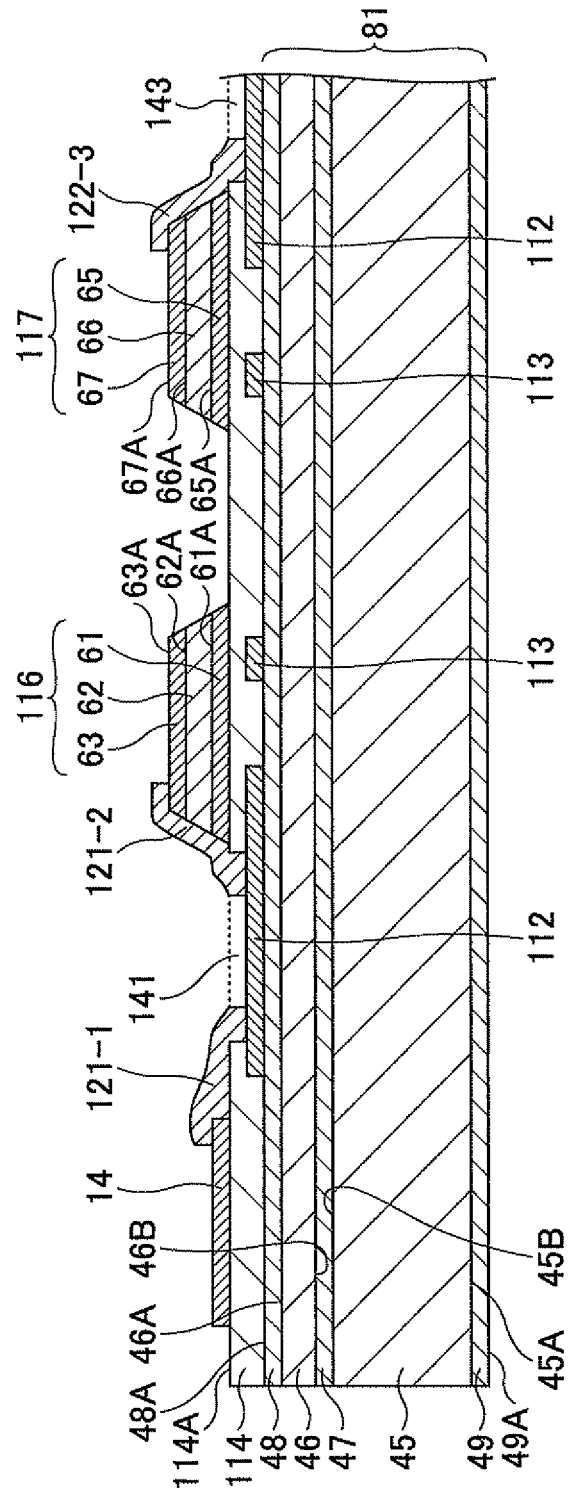
FIG. 39 is a drawing illustrating a manufacturing process (part 13) of the piezoelectric actuator according to the second embodiment of the present invention.

Next, in the process illustrated in FIG. 39, the same process as illustrated in FIG. 12 and described above in connection with the first embodiment is performed to form the first insulating elements 121-1, 121-2, 121-3 and 121-4 and the second insulating elements 122-1, 122-2 and 122-3 simultaneously (an insulating element forming process).

The first insulating element 121-1 is formed such that it extends from the end portion of the pad 14 located near the opening 141 to the upper surface of the wiring 112 exposed via the opening 141. The first insulating element 121-2 is formed such that it covers a part of the side of the first piezoelectric cantilever 116 located near the opening 141, and extends from the first upper electrode 63 to a part of the upper surface of the wiring 112 exposed via the opening 141.

The first insulating elements 121-3 are formed such that they cover parts of the sides of the first piezoelectric cantilevers 116 located near the openings 142, and extend from the first upper electrodes 63 to parts of the upper surface of the wiring 112 exposed via the openings 142. The first insulating elements 121-4 are formed such that they cover parts of the sides of the first piezoelectric cantilevers 116 located near the openings 143, and extend from the first upper electrodes 63 to parts of the upper surface of the wiring 112 exposed via the openings 143.

The second insulating element 122-1 is formed such that it extends from the end portion of the pad 15 located near the opening 141 to the upper surface of the wiring 113 exposed via the opening 141. The second insulating elements 122-2 are formed such that they cover parts of the sides of the second piezoelectric cantilevers 117 located near the openings 142, and extend from the second upper electrodes 67 to parts of the upper surface of the wiring 113 exposed via the openings 142.

The second insulating elements 122-3 are formed such that they cover parts of the sides of the second piezoelectric cantilevers 117 located near the openings 143, and extend from the second upper electrodes 67 to parts of the upper surface of the wiring 113 exposed via the openings 143.

The first insulating elements 121-1, 121-2, 121-3 and 121-4 and the second insulating elements 122-1, 122-2 and 122-3 may be formed from a photosensitive resin (a photosensitive resist, for example).

In this way, since the first insulating elements 121-1, 121-2, 121-3 and 121-4 and the second insulating elements 122-1, 122-2 and 122-3 are formed using a photosensitive resin (a photosensitive resist, for example), the first insulating elements 121-1, 121-2, 121-3 and 121-4 and the second insulating elements 122-1, 122-2 and 122-3 can be formed at low cost.

Further, since first insulating elements 121-1, 121-2, 121-3 and 121-4 and the second insulating elements 122-1, 122-2 and 122-3 are formed using a photosensitive resin (a photosensitive resist, for example), the upper surfaces of the first insulating elements 121-1, 121-2, 121-3 and 121-4 and the second insulating elements 122-1, 122-2 and 122-3 become gently inclined, which enables making the thickness of the wirings 131-137 uniform.

Therefore, it is possible to improve reliability of electrical coupling between the first upper electrodes 63 and the wiring 112 which are electrically coupled via the wirings 131 and 133-135 as well as reliability of electrical coupling between the second upper electrodes 67 and the wiring 113 which are electrically coupled via the wirings 132, 136 and 137.

Figure 40:
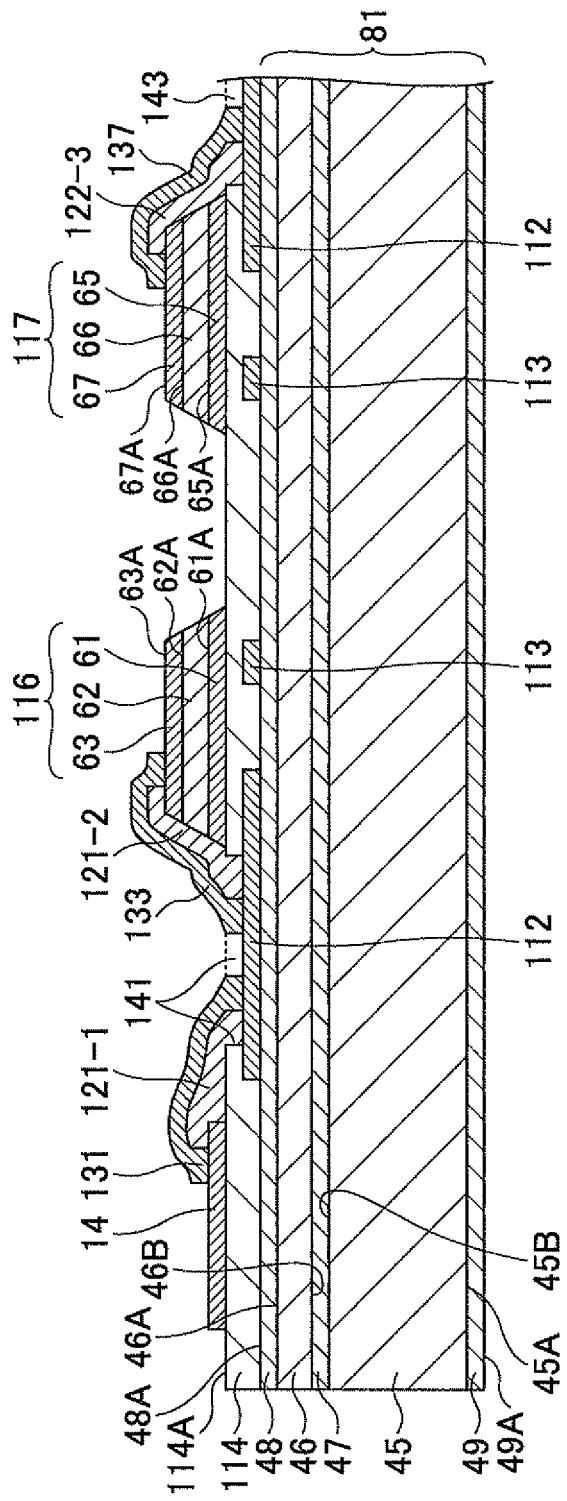
FIG. 40 is a drawing illustrating a manufacturing process (part 14) of the piezoelectric actuator according to the second embodiment of the present invention.

Next, in the process illustrated in FIG. 40, the same processes as illustrated in FIGS. 13-15 and described above in connection with the first embodiment are performed to form the wirings 131-137 (a fourth/fifth wiring forming process).

Figure 41:
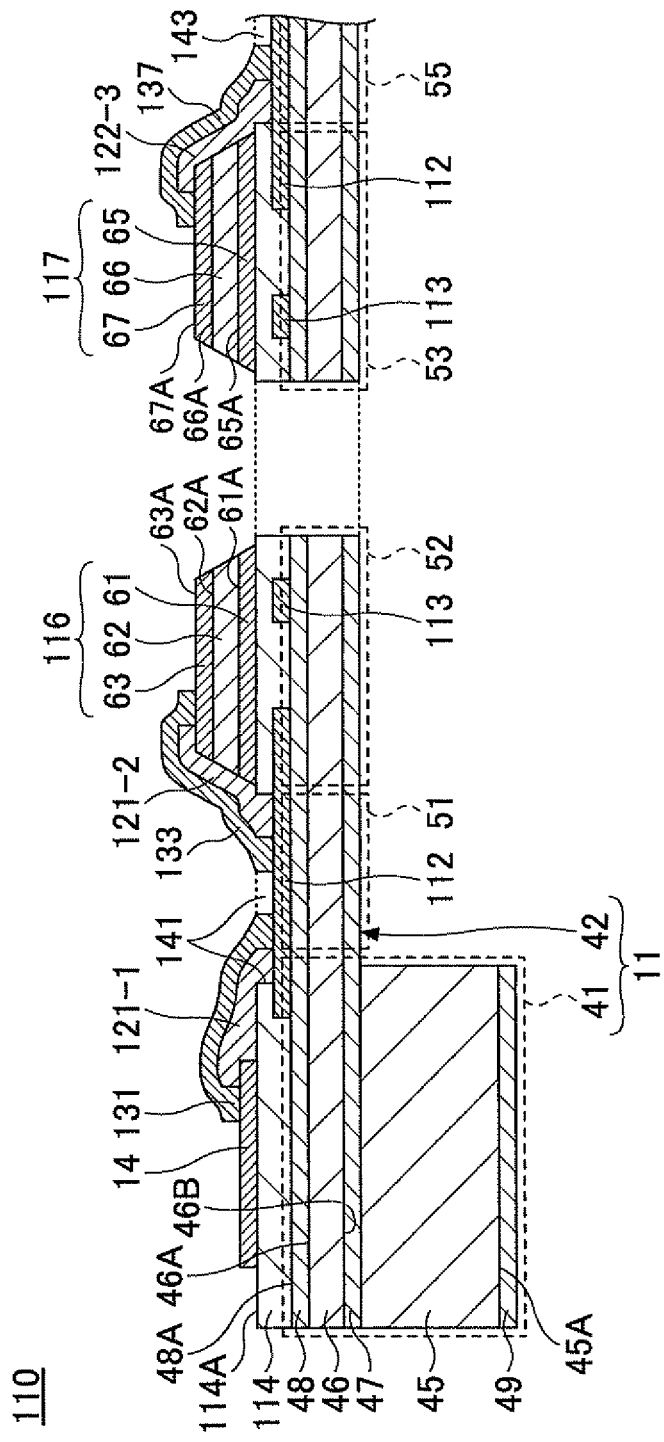
FIG. 41 is a drawing illustrating a manufacturing process (part 15) of the piezoelectric actuator according to the second embodiment of the present invention.

It is noted that in FIGS. 40 and 41, the illustrations of the wirings 132 and 134-136 are omitted because they are difficult to be illustrated in these drawings.

The wiring 131 is formed on the upper surface of the first insulating element 121-1 such that it is coupled to the pad 14 and the wiring 112. The wiring 132 is formed on the upper surface of the second insulating element 122-1 such that it is coupled to the pad 15 and the wiring 113.

The wiring 133 is formed on the upper surface of the first insulating element 121-2 such that it is coupled to a part of the wiring 112 exposed via the opening 141 and the first upper electrode 63. The wirings 134 are formed on the upper surface of the first insulating element 121-3 such that they are coupled to parts of the wiring 112 exposed via the openings 142 and the first upper electrodes 63.

The wirings 135 are formed on the upper surface of the first insulating element 121-4 such that they are coupled to parts of the wiring 112 exposed via the openings 143 and the first upper electrodes 63. The wirings 136 are formed on the upper surface of the second insulating element 122-2 such that they are coupled to parts of the wiring 113 exposed via the openings 142 and the second upper electrodes 67.

The wirings 137 are formed on the upper surface of the second insulating element 122-3 such that they are coupled to parts of the wiring 113 exposed via the openings 143 and the second upper electrodes 67.

In this way, by forming the wirings 131-137, the pad 14 and the first upper electrodes 63 are electrically coupled and the pad 15 and the second upper electrodes 67 are electrically coupled.

The wirings 131-137 may be formed of Ti/Ni/Au multilayered films or Al films (thickness of 100 nanometers, for example). The Ti/Ni/Au multilayered film is formed by successively stacking a Ti film (thickness of 25 nanometers, for example), a Ni film (thickness of 25 nanometers, for example) and an Au film (thickness of 100 nanometers, for example).

By using the Ti/Ni/Au multilayered films or Al films to form the wirings 131-137, it is possible to reduce resistance values of the wirings 131-137.

Next, in the process illustrated in FIG. 41, the same processes as illustrated in FIGS. 16 and 17 and described above in connection with the first embodiment are performed to form the support member 11 including the frame body 41 and the support body 42. In this way, the piezoelectric actuator 110 according to the second embodiment is manufactured.

According to the manufacturing process of the piezoelectric actuator of the present embodiment, since the wirings 112 and 113 are formed by patterning the metal layer 147, components of the second and third wirings 112 and 113 no longer include the piezoelectric material, which prevents the reduction of the bending efficiency of the piezoelectric actuator 110 due to the wirings 112 and 113.

Further, since the wirings 112 and 113 are formed on the upper surfaces of the coupling part 51 and the first, second third support parts 52-55, and the first and second piezoelectric cantilevers 116 and 117 are formed on the upper surface 114A of the insulating layer 114 which covers the wirings 112 and 113 provided on the first and second support parts 52 and 53, the first and second piezoelectric cantilevers 116 and 117 can be formed over the overall upper surface 114A of the insulating layer 114 provided on the first and second support parts 52 and 53, thereby increasing the bending amounts of the first and second piezoelectric cantilevers 116 and 117.

Further, the present invention is not limited to these embodiments, but various variations and modifications may be made without departing from the scope of the present invention.

Industrial Applicability

The present invention can be applied to a piezoelectric actuator and a method of manufacturing the same.

The present application is based on Japanese Priority Application No. 2009-106085, filed on Apr. 24, 2009, the entire contents of which are hereby incorporated by reference.

The invention claimed is:

1. A piezoelectric actuator comprising:
a support member including a frame body and a support body which is thinner than the frame body and has an end portion integrated with the frame body, the support body including plural first, second and third support parts, wherein the first support parts correspond to areas for forming first piezoelectric cantilevers, the second support parts correspond to areas for forming second piezoelectric cantilevers and are separated from the first support parts, and the third support parts couple the first support parts and the second support parts;
first piezoelectric cantilevers each including a first piezoelectric body between a pair of a first electrode and a second electrode;
second piezoelectric cantilevers each including a second piezoelectric body between a pair of a third electrode and a fourth electrode;
first wirings provided on an upper surface of the support body for electrically coupling the first electrodes and the third electrodes;
a second wiring provided on the upper surface of the support body, the second wiring being electrically coupled to the second electrodes provided on the first support parts, and extending in the same direction as the second piezoelectric cantilevers; and
a third wiring provided on the upper surface of the support body, the third wiring being electrically coupled to the fourth electrodes provided on the second support parts, and extending in the same direction as the first piezoelectric cantilevers;

wherein the second and third wirings are formed of metal films.

2. The piezoelectric actuator claimed as in claim 1, wherein the second and third wirings have resistance lower than the first electrodes and the third electrodes.

3. The piezoelectric actuator claimed as in claim 1, wherein the metal films are a Ti/Ni/Au multilayered film or an Al film, the Ti/Ni/Au multilayered film being formed by successively stacking a Ti film, a Ni film and an Au film.

4. The piezoelectric actuator claimed as in claim 1, wherein the second and third wirings are disposed on the upper surface of the support body, an insulating layer whose upper surface is flat is provided for covering a part of the upper surface of the support body which is associated with the first and second support parts, and a part of the second and third wirings which is disposed on the part of the upper surface of the support body associated with the first and second support parts, the first piezoelectric cantilevers are provided on parts of the upper surface of the insulating layer provided on the first support parts, and the second piezoelectric cantilevers are provided on parts of the upper surface of the insulating layer provided on the second support parts.

5. The piezoelectric actuator claimed as in claim 4, wherein parts of the insulating layer which are provided on the third support parts have openings formed for exposing parts of the upper surfaces of the second and third wirings which are provided on the third support parts, the piezoelectric actuator further comprising: first insulating elements covering sides of the first piezoelectric cantilevers;

fourth wirings provided on the first insulating elements, each of the fourth wirings having one end portion coupled to corresponding one of the first upper electrode and another end portion coupled to a part of the second wiring which is exposed through corresponding one of the openings;

second insulating elements covering sides of the second piezoelectric cantilevers; and fifth wirings provided on the second insulating elements, each of the fifth wirings having one end portion coupled to corresponding one of the second upper electrode and another end portion coupled to a part of the third wiring which is exposed through corresponding one of the openings.

6. The piezoelectric actuator claimed as in claim 1, wherein the first wiring is formed on the third support parts.

7. A piezoelectric actuator, comprising:

a support member including a frame body and a support body which is thinner than the frame body and has an end portion integrated with the frame body, the support body including plural first, second and third support parts, wherein the first support parts correspond to areas for forming first piezoelectric cantilevers, the second support parts correspond to areas for forming second piezoelectric cantilevers and are separated from the first support parts, and the third support parts couple the first support parts and the second support parts;

first piezoelectric cantilevers each including a first piezoelectric body between a pair of a first electrode and a second electrode;

second piezoelectric cantilevers each including a second piezoelectric body between a pair of a third electrode and a fourth electrode, first wirings provided on an upper surface of the support body for electrically coupling the first electrodes and the third electrodes;

a second wiring provided on the upper surface of the support body, the second wiring being electrically coupled to the second electrodes provided on the first support parts, and extending in the same direction as the second piezoelectric cantilevers; and a third wiring provided on the upper surface of the support body, the third wiring being electrically coupled to the fourth electrodes provided on the second support parts, and extending in the same direction as the first piezoelectric cantilevers, wherein sides of the first piezoelectric cantilevers are inclined such that the widths of the first piezoelectric cantilevers increase when viewed from the second electrodes to the first electrodes, and sides of the second piezoelectric cantilevers are inclined such that the widths of the second piezoelectric cantilevers increase when viewed from the fourth electrodes to the third electrodes.

* * * * *